United States Patent
Majima et al.

(10) Patent No.: US 7,510,592 B2
(45) Date of Patent: Mar. 31, 2009

(54) METHOD OF PRODUCING METAL POWDER

(75) Inventors: Masatoshi Majima, Osaka (JP); Kohei Shimoda, Osaka (JP); Issei Okada, Osaka (JP); Masahiro Yamakawa, Osaka (JP); Takashi Kasuga, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 335 days.

(21) Appl. No.: 10/559,021

(22) PCT Filed: Dec. 8, 2004

(86) PCT No.: PCT/JP2004/018281

§ 371 (c)(1),
(2), (4) Date: Nov. 30, 2005

(87) PCT Pub. No.: WO2005/065868

PCT Pub. Date: Jul. 21, 2005

(65) Prior Publication Data

US 2007/0089565 A1    Apr. 26, 2007

(30) Foreign Application Priority Data

Dec. 26, 2003 (JP) ............................. 2003-434923
Mar. 18, 2004 (JP) ............................. 2004-079226

(51) Int. Cl.
*B22F 9/24* (2006.01)
(52) U.S. Cl. .......................................... 75/370; 75/371
(58) Field of Classification Search ................. 75/371, 75/372
See application file for complete search history.

(56) References Cited

U.S. PATENT DOCUMENTS

| 3,663,303 | A | * | 5/1972 | Dietz | ......................... | 502/101 |
| 5,041,195 | A | * | 8/1991 | Taylor et al. | ................. | 205/508 |
| 5,620,584 | A | * | 4/1997 | Reetz et al. | ................. | 205/334 |
| 7,220,697 | B2 | * | 5/2007 | Pak et al. | ..................... | 502/185 |
| 2002/0194958 | A1 | * | 12/2002 | Lee et al. | ....................... | 75/370 |
| 2005/0106449 | A1 | * | 5/2005 | Fan et al. | ....................... | 429/44 |
| 2006/0032755 | A1 | * | 2/2006 | Herman et al. | .............. | 205/109 |
| 2006/0090596 | A1 | * | 5/2006 | Goia et al. | .................... | 75/371 |

FOREIGN PATENT DOCUMENTS

JP    53-065226    6/1978

(Continued)

OTHER PUBLICATIONS

International Preliminary Report on Patentability and Written Opinion issued in corresponding International Patent Application No. PCT/JP2004/018281, dated Aug. 3, 2006.

*Primary Examiner*—George Wyszomierski
(74) *Attorney, Agent, or Firm*—McDermott Will & Emery LLP

(57) ABSTRACT

A method of producing metal powder by reducing ions of a metal for precipitation by performance of a reducing agent in a liquid-phase reaction system, wherein the metal is precipitated as metal powder particles by being reduced under conditions in which the exchange-current density of an oxidation-reduction reaction between the metal ions and the reducing agent is 100 μA/cm² or less, the exchange-current density being determined by the mixed potential theory.

5 Claims, 1 Drawing Sheet

FOREIGN PATENT DOCUMENTS

| | | |
|---|---|---|
| JP | 2-169029 | 6/1990 |
| JP | 2-303541 | 12/1990 |
| JP | 4-298238 | 10/1992 |
| JP | 5-161849 | 6/1993 |
| JP | 6-031166 | 2/1994 |
| JP | 6-031181 | 2/1994 |
| JP | 8-162122 | 6/1996 |
| JP | 52-124429 | 10/1997 |
| JP | 11-080647 | 3/1999 |
| JP | 2000-107606 | 4/2000 |
| JP | 2000-279811 | 10/2000 |
| JP | 2002-231255 | 8/2002 |
| JP | 2002-332509 | 11/2002 |

* cited by examiner

METHOD OF PRODUCING METAL POWDER

RELATED APPLICATION

This application is a national phase of PCT/JP2004/018281 filed on Dec. 8, 2004, which claims priority from Japanese Application No. 2003-434923 which was filed on Dec. 26, 2003 and Japanese Application No. 2004-079226 which was filed on Mar. 18, 2004, the disclosures of which Applications are incorporated by reference herein. The benefit of the filing and priority dates of the International and Japanese Applications is respectfully requested.

TECHNICAL FIELD

The present invention relates to a method of producing micro-fine metal powder.

BACKGROUND ART

In general, noble metals such as platinum and palladium are used as catalysts for fuel cells and off-gas cleanup. However, the amount of the noble-metal elements on the earth is limited, and therefore this situation requires a reduction of the use of the noble-metal elements. Accordingly, a catalyst using a noble-metal is generally made such that micro powder particles are deposited on the surfaces of carrier particles of, for example, carbon or an inorganic compound. The catalytic action mainly occurs on the surfaces of the noble metals. Therefore, in order to reduce the amount of noble metals used as the catalysts having the structure mentioned above and to maintain sufficient activities as the catalysts, the noble-metal powder on the carrier particle surfaces is required to have a smaller particle size and a larger specific surface area.

Recently, using a metal powder, in particular, noble-metal powder of gold, silver or the like, as pigment of an ink-jet ink has been investigated, for example, in order to do electroconductive-powder printing and metallic printing with ink-jet printers. The noble-metal powder used for such uses is also required to have a smaller particle size and a narrow particle-size distribution, though the requirement is less strict than that for the catalysts.

These types of micro-fine metal powder are produced by high-temperature processing called an impregnation method, a liquid-phase reduction method, or a gas-phase method. In particular, the liquid-phase reduction method, i.e. reducing ions of a metal to be precipitated with a reducing agent in a liquid-phase reaction-system to precipitate the metal as metal powder, has been broadly used thus far because of its ease in simplifying facilities. Various compounds have been proposed as the reducing agent used in the liquid-phase reduction method. Examples of the proposed reducing agents include the following:

Aldehyde (Patent Document 1);

Sodium hypophosphite, potassium hypophosphite, or ammonium hypophosphite (Patent Document 2);

Ascorbic acid (Patent Document 3);

Thiourea or thioacetamide (Patent Document 4);

Ally alcohol, hydrazine hydrate, and hydrogen gas (Patent Document 5);

Propargyl alcohol and hydrogen gas (Patent Document 6);

Alcohol, such as ethanol, and hydrogen gas (Patent Document 7);

Amines, in particular, alkanolamine (Patent Document 8);

Alcohols such as ethanol (Patent Document 9);

Amino-alcohol (Patent Document 10); and

Hydrogen gas or sodium borohydride (Patent Document 11).

In order to produce metal powder having a small particle size by the liquid-phase reduction method, it is effective to conduct the reduction and precipitation of the metal powder at a slower rate. Therefore, it is important to use a reducing agent with lower reducing power. The above-mentioned catalysts are ranked in the order of reducing power from the highest to the lowest as follows: sodium boron hydride or hydrogen gas>hypophosphite reducing agents>ascorbic acid>alkanolamine (amino-alcohol)>alcohol (ethanol, etc.).

Patent Document 1: Japanese Unexamined Patent Application Publication No. 2-169029 (claim 1, page 2, lines 16 to 20 of bottom left column and lines 13 to 19 of bottom right column on same page)

Patent Document 2: Japanese Unexamined Patent Application Publication No. 2-303541 (claim 1, page 2, lines 2 to 7 of bottom left column and from line 18 of bottom right column on page 2 to line 18 of upper left column on page 3)

Patent Document 3: Japanese Unexamined Patent Application Publication No. 4-298238 (claim 1 and paragraph 0005)

Patent Document 4: Japanese Unexamined Patent Application Publication No. 5-161849 (claim 1, and paragraphs 0007, 0009, and 0010)

Patent Document 5: Japanese Unexamined Patent Application Publication No. 6-31166 (claim 1 and paragraph 0005)

Patent Document 6: Japanese Unexamined Patent Application Publication No. 31181 (claim 1 and paragraph 0004)

Patent Document 7: Japanese Unexamined Patent Application Publication No. 8-162122 (claim 1, and paragraphs 0007, 0013, 0014, and 0017)

Patent Document 8: Japanese Unexamined Patent Application Publication No. 11-80647 (claims 14 and 15, and paragraph 0051)

Patent Document 9: Japanese Unexamined Patent Application Publication No. 2000-107606 (claim 1, and paragraphs 0009 and 0017)

Patent Document 10: Japanese Unexamined Patent Application Publication No. 2000-279811 (claim 1 and paragraph 0013)

Patent Document 11: Japanese Unexamined Patent Application Publication No. 2002-231255 (claim 3 and paragraph 0014)

DISCLOSURE OF INVENTION

Problems to be Solved by the Invention

As a result of their studies, the inventors found that the particle sizes of the metal powders produced according to the methods using the above-mentioned reducing agents disclosed in these Patent Documents are not sufficiently small yet and that the particle size of a metal powder can be further decreased.

It is an object of the present invention to provide a novel method of producing a metal powder having a particle size smaller than that of the conventional powders.

Means for Solving the Problems

According to the studies by the inventors, reduction and precipitation reactions of metal powder in a liquid-phase reduction method are roughly classified into the following processes:

(1) A nucleation process caused on the occasion when metal ions to be reduced return to a saturated state from a super-saturated state in a liquid phase;
(2) An adsorption process in which the metal ions in the liquid phase are adsorbed on the generated nuclei;
(3) A mass-transfer process in which a reducing agent approaches to the metal ions in the liquid phase;
(4) An electron-transfer process in which the reducing agent afford the electrons thereof to the metal ions; and
(5) A mass-transfer process in which the reducing agent oxidized by electron transfer leaves the vicinity of the reduced metal.

In order to decrease the particle size of metal powder, it will be effective to generate the largest possible amount of nuclei in process (1) and to suppress the nuclear growth in each of processes (2) to (5). The number of the nuclei generated in process (1) can be increased by controlling the metal-ion concentration in the liquid phase or the temperature of the liquid phase. It is also common to investigate such conditions in performing the conventional liquid-phase reduction method.

As understood from a low ionization tendency of noble-metal ions, the reduction of noble-metal ions to a metal state is a reaction that can very readily occur. In view of the fact that the lower the reducing power of the reducing agent, the slower the proceeding of the electron-transfer in process (4), a method has been investigated in the past in which the nuclear growth is suppressed by slowing the electron transfer through the use of a reducing agent having lower reduction power as described above so that the particle size of metal powder may be decreased. However, only decreasing the reducing power of the reducing agent to decrease the particle size of the metal powder has a limited effect. Therefore, it is necessary to suppress the progress of other processes in order to further decrease the particle size of the metal powder, compared to the conventional size.

The inventors have conducted various studies from this viewpoint. As a result of the studies, the inventors found that the size of metal powder particles can be decreased more as compared with conventional metal powder particles by suppressing the nuclear growth in processes (2) to (5) as a whole by performing the liquid-phase reduction method under conditions in which the exchange-current density for an oxidation-reduction reaction between the metal ions and the reducing agent is 100 $\mu A/cm2$ or less. The exchange-current density can be determined according to the mixed potential theory and the liquid-phase reduction under such exchange-current density can be accomplished by selecting a type of the reducing agent as in the conventional methods, and in addition, by controlling the concentration of the reducing agent, a type of a metal compound for supplying metal ions, the concentration of the metal compound, a state of the metal ions in a liquid phase, the temperature of the liquid phase, pH, existence or nonexistence of an additive agent, and so on.

A first aspect of the present invention is a method of producing metal powder, in which method the ions of a metal to be precipitated are reduced with a reducing agent in a liquid-phase reaction system so that the metal is precipitated as metal powder particles, wherein the metal ions are reduced under conditions in which the exchange-current density of an oxidation-reduction reaction between the metal ions and the reducing agent is 100 $\mu A/cm^2$ or less, the exchange-current density being determined by the mixed potential theory.

A second aspect of the present invention is the method of producing metal powder according to the first aspect, wherein the reducing agent is reducing saccharides or glycitols. Since the reducing power of reducing saccharides and glycitols is low, reducing saccharides and glycitols effectively slow the electron transfer in process (4). Furthermore, since reducing saccharides and sugar alcohol have a molecular weight larger than those of other reducing agents and cannot readily migrate because of resistance due to the liquid phase, reducing saccharides and glycitols also slow the mass transfers in processes (3) and (5) effectively. Thus, reducing saccharides and glycitols can suppress the nuclear growth and are superior in decreasing the particle size of metal powder.

Reducing saccharides and glycitols do not contain impurity elements, e.g. halogens (such as chlorine), sulfur, phosphorus, and boron; therefore, deformation of the metal powder caused by abnormal nuclear growth having its origination in these impurity elements and the nuclear growth at a very high rate are avoided. Consequently, according to the second aspect of the present invention, the particle size of the metal powder can be further decreased.

A third aspect of the present invention is a method of producing metal powder according to the first aspect, wherein the metal ions are reduced under the condition in which carrier particles are dispersed in a liquid-phase reaction system, and thereby the metal powder particles are deposited on the surfaces of the carrier particles. According to the third aspect of the present invention, it is possible to further decrease the particle sizes of a noble-metal powder, such as platinum powder, in a catalyst having a structure in which the noble-metal powder particles are deposited on the surfaces of the carrier particles and to decrease the amount of the noble-metal usage while a high catalytic activity is maintained.

Examples of the carrier particles include carbon particles and inorganic compound particles. A fourth aspect of the present invention is the method of producing metal powder according to the third aspect, wherein the carrier particles are made of carbon or an inorganic compound.

A fifth aspect of the present invention is the method of producing metal powder according to the first aspect of the present invention, wherein the metal ions are reduced in a liquid-phase reaction system so that metal powder particles are individually independently precipitated. According to the fifth aspect of the present invention, the particle size of a noble-metal powder made of gold, silver, or the like can be further decreased to be suitable for pigment of ink-jet ink. Since a particle-size distribution of metal powder can be decreased by slowing the nuclear growth, a noble-metal powder having a sharp particle-size distribution can also be produced, according to the fifth aspect of the present invention.

ADVANTAGEOUS EFFECT OF THE INVENTION

According to the method of the present invention, as described above, metal powder having a small particle size can be precipitated by controlling various factors, i.e. the type of the reducing agent and other factors, for conducting the liquid-phase reduction method and by reducing a metal under conditions in which the exchange-current density, which is determined by the mixed potential theory, of an oxidation-reduction reaction between metal ions and a reducing agent is 100 $\mu A/cm2$ or less. In other words, the metal powder having a small particle size can be precipitated by reducing the metal ions for precipitation with the reducing agent in a liquid-phase reaction system prepared by adjusting the metal ions, the reducing agent, and various additive agents, if necessary.

Furthermore, in the case where the carrier particles are dispersed in the reaction system, it is possible to produce a catalyst having a structure in which the noble-metal powder of platinum or the like is deposited on the surfaces of carrier particles made of carbon or an inorganic compound. When the method according to the present invention is performed in a reaction system without the dispersion of the carrier particles, the above-mentioned noble-metal powder of gold, silver, or the like, which is suitable for the pigment of ink-jet ink, can be produced.

BEST MODE FOR CARRYING OUT THE INVENTION

Figure 1:
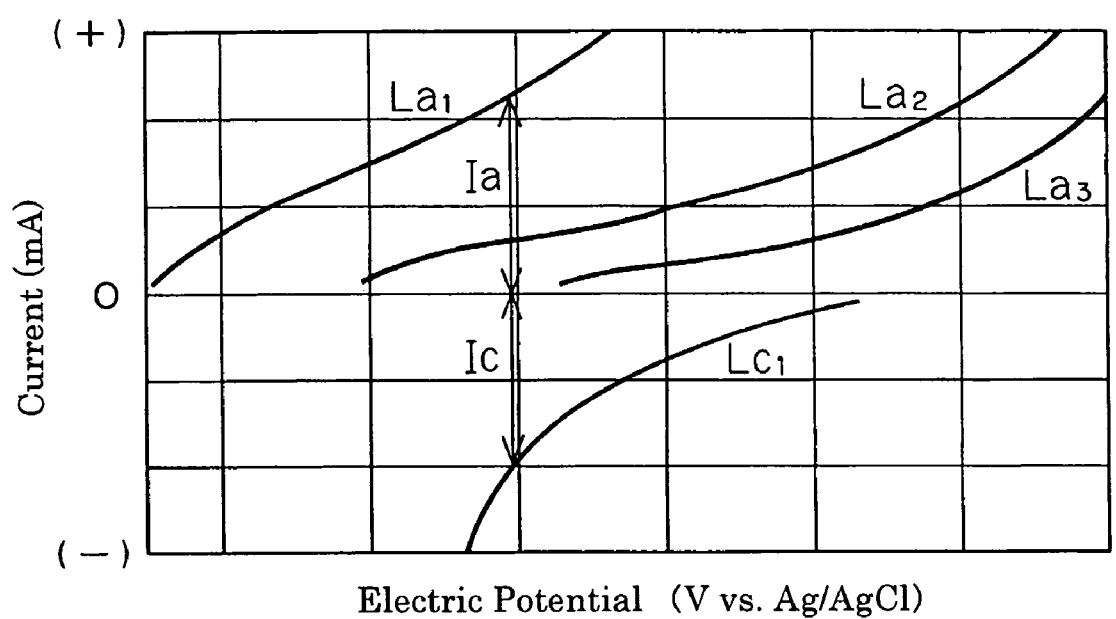
FIG. 1 is a graph showing polarization curves of metal compounds and reducing agents measured when the exchange-current density of an oxidation-reduction reaction is determined.

The present invention will now be described.

<Method of Measuring Exchange-Current Density>

Exchange-current density of an oxidation-reduction reaction is measured by polarization measurement with a three-electrode electrolytic cell having a reference electrode, a counter electrode, and a working electrode. The reference electrode is a silver/silver chloride electrode, the counter electrode is a platinum electrode, and the working electrode is made of a metal for determining exchange-current density, i.e. the same metal as that to be precipitated.

By polarization measurement using these three electrodes, an exchange-current density under predetermined conditions for a reaction in a combination of a particular reducing agent (referred to as Reducing Agent 1) and a particular metal compound (referred to as Metal Compound 1) as a metal ion source can be determined in the following manner. At first, a solution, which contains the same components except Metal Compound 1 as those in a reaction system for producing metal powder by a liquid-phase reduction method using Reducing Agent 1 and Metal Compound 1, is prepared. Then, the three electrodes are dipped into the solution under the same conditions (temperature, with or without stirring, etc.) as those when the metal powder is actually produced. Subsequently, by plotting changes in current while sweeping applied voltage at a constant scanning rate (usually 1 mV/sec) toward the positive direction from a rest potential which occurs when the electrodes are dipped, a polarization curve (for example, polarization curve La1 in FIG. 1) of Reducing Agent 1 on the oxidization side is determined.

At the same time, a solution containing the same components as those in the reaction system except Reducing Agent 1 is prepared. Then, the three electrodes are dipped into this solution under the same conditions (temperature, with or without stirring, etc.) as those when the metal powder is actually produced. Subsequently, by plotting changes in the current while sweeping applied voltage at a constant scanning rate (usually 1 mV/sec) toward the negative direction from a rest potential which occurs when the electrodes are dipped, a polarization curve (for example, polarization curve Lc1 in FIG. 1) of Metal Compound 1 on the reduction side is determined.

The exchange-current density ($\mu A/cm^2$) of the oxidation-reduction reaction can be calculated using the polarization curve $La_1$ of Reducing Agent 1 and the polarization curve $Lc_1$ of Metal Compound 1 determined as in the above description. More specifically, as shown in FIG. 1, a voltage (V) when an oxidation current Ia (mA) and a reduction current Ic (mA) are balanced, namely, a voltage when the absolute value of the oxidation current Ia is equal to the absolute value of the reduction current Ic, as defined by the following Formula (1), is determined.

$$|Ia|=|Ic| \quad (1)$$

Then, the absolute value of the oxidation current Ia (which is equal to the absolute value of the reduction current Ic) at this voltage is divided by the surface area ($cm^2$) of the working electrode. Thus, the exchange-current density ($\mu A/cm^2$) is determined.

Curves $La_2$ and $La_3$ in FIG. 1 are polarization curves for other reducing agents, which are measured in the same manner as the above. With reference to the drawing, an oxidation current of a reducing agent (referred to as Reducing Agent 2) showing the polarization curve $La_2$ is lower than that of Reducing Agent 1 at the same voltage. Therefore, it is observed that the exchange-current density of an oxidation-reduction reaction when Reducing Agent 2 is used with Metal Compound 1 can be smaller than that when Reducing Agent 1 is used with Metal Compound 1.

Furthermore, an oxidation current of a reducing agent (referred to as Reducing Agent 3) showing the polarization curve $La_3$ is lower than that of Reducing Agent 2 at the same voltage. Therefore, the exchange-current density of an oxidation-reduction reaction when Reducing Agent 3 is used with Metal Compound 1 can be further decreased than that when Reducing Agent 2 is used with Metal Compound 1. This is because differences in reducing power and molecular weight of the reducing agents affect the proceeding speeds of processes (2) to (5). Thus, it is confirmed that exchange-current density of an oxidation-reduction reaction can be controlled by selecting a reducing agent used in a combination with a metal compound.

A polarization curve (not shown) of a metal compound other than Metal Compound 1, which functions as a metal ion source, is different from that of Metal Compound 1. This is because a difference in valence of metal ions constituting metal compounds, a difference in ionization potential of counter ions constituting the metal compound with the metal ions, and difference in size (atomic weight and molecular weight) of the counter ions affect the proceeding speeds of processes (2) to (5). Thus, it is confirmed that exchange-current density of an oxidation-reduction reaction can also be controlled by changing the type of the metal compound.

Furthermore, proceeding speeds of the above-mentioned processes (2) to (5) can be further lowered, for example, by stabilizing metal ions generated from Metal Compound 1 by forming a complex with other ions in a liquid phase. Thus, the exchange-current density of an oxidation-reduction reaction can also be controlled by regulating the state of the metal ions in the liquid phase.

Polarization curves are varied by conditions (temperature, with or without stirring, etc.) when metal powder is produced, even if the same reducing agent and the same metal compound are used. Therefore, the exchange-current density of an oxidation-reduction reaction can be controlled by regulating the conditions. This is because the proceeding speeds of processes (2) to (5) are varied by the conditions of the reaction.

In the present invention, the exchange-current density of an oxidation-reduction reaction is controlled at 100 $\mu A/cm^2$ or less by regulating the various conditions, as described above.

Thus, excellent metal powder having a very small particle size, which cannot be produced by conventional methods, and having a sharp particle-size distribution can be produced.

However, if exchange-current density is too low, the production of the metal powder having a predetermined particle size may take a very long period of time because nuclear growth is too slow, or the metal powder may not be precipitated at all. Therefore, in view of productivity of the metal powder, the exchange-current density of an oxidation-reduction reaction is preferably 1 μA/cm$^2$ or more within the above range.

<Reducing Agent>

Any known reducing agent can be used if it can control the exchange-current density of an oxidation-reduction reaction to 100 μA/cm2 or less by using it in combination with a proper metal compound under appropriate conditions. In particular, for decreasing the particle size of metal powder, it is preferable to use a reducing agent having low reducing power and capable of slowing the progress of the electron-transfer in process (4).

Examples of these reducing agents include alcohols such as methanol, ethanol, and isopropyl alcohol, and ascorbic acid, as disclosed in the above-mentioned Patent Documents. Other examples include ethylene glycol; glutathione; organic acids such as citric acid, malic acid, and tartaric acid; reducing saccharides such as glucose, galactose, mannose, fructose, sucrose, maltose, raffinose, and stachyose; and glycitols such as sorbitols. In particular, reducing saccharides and derivatives thereof, i.e. glycitols, are preferable.

Since reducing saccharides and glycitols have low reducing power as a reducing agent as described above, they are highly effective to lower the speed of the electron-transfer in process (4). Moreover, the reducing saccharides and glycitols can slow the progress of the mass transfer in processes (3) and (5) since they cannot readily migrate because they have a molecular weight larger than those of other reducing agents and accordingly they receive large resistance from a liquid phase. Thus, reducing saccharides and glycitols are superior in decreasing a particle size of metal powder.

Furthermore, since the reducing saccharides and glycitols do not contain impurity elements such as halogens (such as chlorine), sulfur, phosphorus, and boron, a very high rate nuclear growth or deformation of metal powder particles caused by abnormal nuclear growth originating in these impurity elements can be avoided. Examples of most preferable reducing saccharides and glycitols include glucose, galactose, fructose, sucrose, maltose, raffinose, stachyose, and sorbitol among the above-mentioned compounds because they are industrially easy to obtain.

The concentration of the reducing agent in a liquid-phase reaction-system is not limited. In general, there is a tendency in which the exchange-current density of an oxidation-reduction reaction decreases with the less concentration of the reducing agent, and accordingly the particle size of the resulting metal powder is decreased. Therefore, the concentration range of the reducing agent is preferably determined with consideration for the particle size of the metal powder to be produced, the type of the reducing agent, and other conditions so that the range of exchange-current density is controlled to 100 μA/cm2 or less.

<Metal Ion Source>

The metal compound as the metal ion source for the metal powder is selected from various metal compounds soluble in a liquid phase and containing the metal so that the metal compound in combination with a proper reducing agent under appropriately regulated conditions can control the exchange-current density of an oxidation-reduction reaction to 100 μA/cm2 or less. As mentioned above, if it is possible, preferably the metal compound should not contain impurity elements which may become sources for causing abnormal nuclear growth. However, not withstanding that the metal compound contains impurity elements, metal powder having a small particle size can be produced by selecting a proper reducing agent and appropriately regulating other conditions to suppress the abnormal nuclear growth.

Examples of preferable metal compounds as a metal ion source include, but are not limited to, dinitrodiammineplatinum (II) ($Pt(NO_2)_2(NH_3)_2$) and hydrogen hexachloroplatinate (IV) hexahydrate ($H_2[PtCl_6].6H_2O$) as platinum ion sources, silver (I) nitrate ($AgNO_3$) and silver methanesulfonate ($CH_3SO_3Ag$) as silver ion sources, hydrogen tetrachloroaurate (III) tetrahydrate ($HAuCl_4.4H_2O$) as a gold ion source, a palladium (II) chloride ($PdCl_2$) solution as a palladium ion source, hydrogen hexachloroiridium (III) hexahydrate ($2(IrCl_6).6H_2O$) as an iridium ion source, a rhodium (III) chloride ($RhCl_3.3H_2O$) solution as a rhodium ion source, and a ruthenium (III) nitrate ($Ru(NO_3)_3$) solution as a ruthenium ion source. In particular, dinitrodiammineplatinum (II) and silver (I) nitrate are preferable.

<Additive Agent>

Examples of the additive agents include pH regulators for controlling the pH range of the liquid phase to be suitable for reduction and precipitation of a metal, dispersing agents for dispersing the carrier particles for the catalysts or the supported metal powder, and viscosity modifiers for controlling viscosity of the liquid phase.

Various pH regulators including acids and alkalis can be used. In particular, acids and alkalis not containing an impurity element which may become a source of causing abnormal nuclear growth are preferable. Examples of the pH regulators not containing impurity elements include nitric acid as an acid and aqueous ammonia as an alkali.

The range of pH suitable for the liquid phase depends on the type of metal to be precipitated and the metal compound as the metal ion source. There is a tendency in which the exchange-current density of an oxidation-reduction reaction decreases with a decrease in pH within the suitable range and accordingly the particle size of the resulting metal powder is decreased. Therefore, it is preferable to determine the range of pH suitable for controlling the exchange-current density to 100 μA/cm2 or less, by selecting whether a pH regulator is necessary or not, and if necessary, a suitable amount of the pH regulator to be added, taking into consideration the type and the particle size of the metal powder to be produced, the type of the reducing agent, and other conditions.

Any known dispersing agent and viscosity modifier can be used. Preferably, macromolecular dispersing agents having both of the functions are used. Examples of the macromolecular dispersing agents include amine macromolecular dispersing agent, such as polyethylenimine and polyvinyl pyrrolidone; hydrocarbon macromolecular dispersing agent having carboxylic acid group in the molecule, such as carboxymethylcellulose; and copolymers having both of a polyethylenimine moiety and a polyethylene oxide moiety in the molecule (referred to as PEI-PO copolymer).

The amount of the macromolecular dispersing agent is not limited. However, the viscosity of a liquid phase increases with increase in the added amount of the macromolecular dispersing agent, and accordingly the exchange-current density of an oxidation-reduction reaction tends to decrease, resulting in the decrease in the particle size of the resulting metal powder. Therefore, the range of the amount of the macromolecular dispersing agent suitable for controlling the exchange-current density at 100 μA/cm$^2$ or less is preferably determined with consideration for the particle size of the metal powder to be produced, the type of the reducing agent, and other conditions.

<Production of Metal Powder: 1>

In the case where a catalyst having a structure in which the noble-metal powder of platinum or the like is deposited on the surfaces of the carrier particles is produced by the method according to the present invention, a liquid-phase reaction system containing a predetermined amount of dispersed carrier particles, a reducing agent, and a metal compound at predetermined concentrations is prepared as in conventional methods. The liquid phase is then put under conditions of a predetermined temperature for a predetermined period of time for reducing the noble-metal of platinum or the like to precipitate in a powdered state on the surfaces of the carrier particles dispersed in the liquid phase. Thus, the catalyst having the structure mentioned above can be produced.

In such a process, the exchange-current density of an oxidation-reduction reaction can be controlled by regulating the temperature and viscosity of the solution and the stirring conditions such as the stirring rate when the stirring is conducted. Namely, there is a tendency in which the exchange-current density of an oxidation-reduction reaction decreases with a decrease in the temperature of the solution, an increase in the viscosity thereof, or a decrease in a stirring rate when the stirring is conducted, resulting in a metal powder with a decreased particle size. Therefore, the ranges of the amounts of additives suitable for controlling the exchange-current density to 100 $\mu A/cm2$ or less are preferably determined with consideration for the particle size of the metal powder to be produced, the type of the reducing agent, and other conditions. The ratio of the metal powder deposited on the surfaces of the carrier particles can be increased by using an alcohol and other reducing agent in combination as the reducing agents.

Examples of the carrier particles include carbon particles and inorganic compound particles. Various types of carbon black can be used as the carbon particles. Examples of the inorganic compound particles include alumina such as γ-alumina; metal oxides such as titanium dioxide, silica, cerium oxide, zirconium oxide, ferrous oxide, and mixed oxides thereof, metal-nitride particles such as titanium nitride, iron nitride, and silicon nitride; and silver sulphide particles.

The particle size of the carrier particles is determined in an arbitrary range depending on the uses of the catalysts. For example, the particle size of the inorganic compound particles is preferably about 50 to 500 $m^2/g$ in terms of a specific surface area. The catalysts thus produced can be used for application to fuel cells or off-gas cleanup after they are subjected to treatment such as filtration, washing, drying, and activation as in a conventional manner.

<Production of Metal Powder: 2>

When noble-metal powder of gold, silver, or the like suitable for pigment of ink-jet ink as described above is produced by the method according to the present invention, a liquid phase containing a reducing agent and a metal compound at predetermined concentrations is prepared, as in conventional methods. The liquid-phase is then put under conditions of a predetermined temperature for a predetermined period of time for reducing the noble-metal of gold, silver, or the like so that particles individually precipitate in a powdered state in the liquid phase. Thus, gold or silver powder can be produced.

In this case also, the exchange-current density of an oxidation-reduction reaction can be slightly controlled by regulating the temperature and viscosity of the solution and the stirring conditions such as existence or nonexistence of stirring and a stirring rate when the stirring is conducted. There is a tendency in which the exchange-current density of an oxidation-reduction reaction decreases with a decrease in the temperature of the solution, an increase in viscosity thereof, or a decrease in a stirring rate when the stirring is conducted, resulting in a metal powder with a decreased particle size. Therefore, the ranges of the amounts of additives suitable for controlling the exchange-current density to 100 $\mu A/cm2$ or less are preferably determined with consideration for the particle size of the metal powder to be produced, the type of the reducing agent, and other conditions.

The gold and silver powders thus produced can be provided in a form of colloid dispersed in a dispersion medium such as water or an organic solvent after they have been subjected to a washing process in the same manner as conventional methods, or in a form of powder after they have been subjected to filtration, washing, and drying processes, so that they can be used as, for example, pigment for manufacturing ink-jet ink or conductive paste.

Thus, it is possible, for example, to form electric wiring on a print circuit board, by means of an ink-jet printer using an ink-jet ink in which gold or silver powder is used as a conductive pigment, or to perform metallic printing with an ink-jet printer using an ink-jet ink in which the gold or silver powder is used as a metallic pigment. Also, it is possible to form, for example, electric wiring of a print circuit board by screen printing using a conductive paste in which the gold or silver powder is used as a conductive pigment.

EXAMPLES

The present invention will now be described with reference to Examples.

<Platinum Powder and Production of Catalysts Using the Platinum Powder: I>

Example 1

A liquid-phase reaction-system was prepared by dispersing carrier particles of carbon black (2 g) having a specific surface area of 800 $m^2/g$ and a surface pH of 9.2 in deionized water (300 ml), adding a dinitrodiammineplatinum (II) nitric acid solution (platinum concentration: 50 g/L) and fructose as a reducing agent in this order, and then adjusting pH to 1.5 by adding nitric acid or aqueous ammonia, if necessary. The resulting reaction system included 0.02 mol/L (M) platinum and 0.20 M fructose. The reaction system was put under conditions of a temperature of 40° C. for 240 hrs with stirring at 400 rpm with a magnetic stirrer for precipitating platinum powder on the surfaces of carbon black. Thus, a catalyst was produced. The exchange-current density of the reaction system was measured by the above-mentioned method to be 4.0 $\mu A/cm^2$. The viscosity of the reaction system was 1 mPa·s at this reaction temperature.

The resulting catalyst was separated by filtration and was washed with deionized water. After drying at 50° C. for 8 hrs, the particle size of the platinum powder deposited on the surfaces of carbon black was measured according to the following procedure. Namely, the resulting catalyst was treated according to a CO adsorption method at a pretreatment temperature of 120° C. and at an adsorption temperature of 50° C. and the amount of CO adsorption was measured. The surface area of the platinum powder deposited on the surfaces of carbon black was calculated from the results. The amount of platinum precipitated in the resulting catalyst was measured by inductively coupled plasma spectrometry (ICP). From this amount and the surface area, the particle diameter of the platinum powder particles deposited on the surfaces of carbon black was calculated to be 1.1 nm.

Example 2

A catalyst was produced as in Example 1 except that the pH of the reaction system was 5.0. The exchange-current density of the reaction system was 7.0 μA/cm². After treating the resulting catalyst as in Example 1, the particle diameter of the platinum powder particles precipitated on carbon black was calculated to be 1.9 nm.

Example 3

A catalyst was produced as in Example 1 except that the pH of the reaction system was 9.0. The exchange-current density of the reaction system was 10.0 μA/cm². After treating the resulting catalyst as in Example 1, the particle size of the platinum powder precipitated on carbon black was calculated to be 2.5 nm.

Example 4

A catalyst was produced as in Example 1 except that the reaction temperature was 80° C. The exchange-current density of the reaction system was 25.0 μA/cm². After treating the resulting catalyst as in Example 1, the particle size of the platinum powder precipitated on carbon black was calculated to be 7.5 nm.

Example 5

A catalyst was produced as in Example 1 except that the fructose concentration as a reducing agent was 0.10 M. The exchange-current density of the reaction system was 3.5 μA/cm². After treating the resulting catalyst as in Example 1, the particle size of the platinum powder precipitated on carbon black was calculated to be 0.9 nm.

Example 6

A catalyst was produced as in Example 1 except that the fructose concentration as a reducing agent was 0.40 M. The exchange-current density of the reaction system was 9.0 μA/cm². After treating the resulting catalyst as in Example 1, the particle size of the platinum powder precipitated on carbon black was calculated to be 2.3 nm.

Example 7

A catalyst was produced as in Example 1 except that the platinum concentration was adjusted to 0.01 M by controlling the amount of the dinitrodiammineplatinum (II) nitric acid solution. The exchange-current density of the reaction system was 3.0 μA/cm². After treating the resulting catalyst as in Example 1, the particle size of the platinum powder precipitated on carbon black was calculated to be 0.8 nm.

Example 8

A catalyst was produced as in Example 1 except that the platinum concentration was adjusted to 0.04 M by controlling the amount of the dinitrodiammineplatinum (II) nitric acid solution. The exchange-current density of the reaction system was 11.0 μA/cm². After treating the resulting catalyst as in Example 1, the particle size of the platinum powder precipitated on carbon black was calculated to be 2.7 nm.

Example 9

A catalyst was produced as in Example 1 except that a macromolecular dispersing agent of polyvinyl pyrrolidone (TOKYO KASEI KOGYO CO., LTD., molecular weight: 10000) was added as an additive agent. The concentration of polyvinyl pyrrolidone in the reaction system was 1 g/L. The exchange-current density of the reaction system was 3.9 μA/cm². After treating the resulting catalyst as in Example 1, the particle size of the platinum powder precipitated on carbon black was calculated to be 1.0 nm.

Example 10

A catalyst was produced as in Example 1 except that a macromolecular dispersing agent of carboxymethylcellulose (Product No. 1105: DAICEL CHEMICAL INDUSTRIES, LTD.) was added as an additive agent. The concentration of carboxymethylcellulose in the reaction system was 1 g/L. The exchange-current density of the reaction system was 3.9 μA/cm². After treating the resulting catalyst as in Example 1, the particle size of the platinum powder precipitated on carbon black was calculated to be 1.0 nm.

Example 11

A catalyst was produced as in Example 1 except that a macromolecular dispersing agent of PEI-PO copolymer (PAO306 of EPOMIN®: NIPPON SHOKUBAI CO., LTD.) was added as an additive agent. The concentration of PEI-PO copolymer in the reaction system was 1 g/L. The exchange-current density of the reaction system was 3.8 μA/cm². After treating the resulting catalyst as in Example 1, the particle size of the platinum powder precipitated on carbon black was calculated to be 1.0 nm.

Example 12

A catalyst was produced as in Example 1 except that hydrogen hexachloroplatinate (IV) hexahydrate was added instead of the dinitrodiammineplatinum (II) nitric acid solution. The platinum concentration in the reaction system was 0.02 M. The exchange-current density of the reaction system was 23.0 μA/cm². After treating the resulting catalyst as in Example 1, the particle size of the platinum powder precipitated on carbon black was calculated to be 6.5 nm.

The results are shown in Table 1. The symbols used in the Table are as follows:

TABLE 1

| | Carrier particle | Metal Compound | | Reducing agent | | Reaction system | | | Reaction time (hr) | Exchange-current density ($\mu A/cm^2$) | Particle size of platinum powder (nm) |
|---|---|---|---|---|---|---|---|---|---|---|---|
| | | Type | Concentration (M) | Type | Concentration (M) | Reaction temperature (° C.) | pH | Additive agent | | | |
| Example 1 | CB | *1 | 0.02 | FL | 0.20 | 40 | 1.5 | None | 240 | 4.0 | 1.1 |
| Example 2 | CB | *1 | 0.02 | FL | 0.20 | 40 | 5.0 | None | 240 | 7.0 | 1.9 |
| Example 3 | CB | *1 | 0.02 | FL | 0.20 | 40 | 9.0 | None | 240 | 10.0 | 2.5 |
| Example 4 | CB | *1 | 0.02 | FL | 0.20 | 80 | 1.5 | None | 240 | 25.0 | 7.5 |
| Example 5 | CB | *1 | 0.02 | FL | 0.10 | 40 | 1.5 | None | 240 | 3.5 | 0.9 |
| Example 6 | CB | *1 | 0.02 | FL | 0.40 | 40 | 1.5 | None | 240 | 9.0 | 2.3 |
| Example 7 | CB | *1 | 0.01 | FL | 0.20 | 40 | 1.5 | None | 240 | 3.0 | 0.8 |
| Example 8 | CB | *1 | 0.04 | FL | 0.20 | 40 | 1.5 | None | 240 | 11.0 | 2.7 |
| Example 9 | CB | *1 | 0.02 | FL | 0.20 | 40 | 1.5 | *a | 240 | 3.9 | 1.0 |
| Example 10 | CB | *1 | 0.02 | FL | 0.20 | 40 | 1.5 | *b | 240 | 3.9 | 1.0 |
| Example 11 | CB | *1 | 0.02 | FL | 0.20 | 40 | 1.5 | *c | 240 | 3.8 | 1.0 |
| Example 12 | CB | *2 | 0.02 | FL | 0.20 | 40 | 1.5 | None | 240 | 23.0 | 6.5 |

Type of carrier particle
CB: Carbon black
Type of metal compound
*1: Dinitrodiammineplatinum (II) nitric acid solution (platinum concentration: 50 g/L)
*2: Hydrogen hexachloroplatinate (IV) hexahydrate
Type of reducing agent
FL: fructose
Type of additive agent
*a: Polyvinyl pyrrolidone (TOKYO KASEI KOGYO CO., LTD., molecular weight: 10000)
*b: Carboxymethylcellulose (Product No. 1105: DAICEl CHEMICAL INDUSTRIES, LTD.)
*c: PEI-PO copolymer (PAO306 of EPOMIN ®: NIPPON SHOKUBAI CO., LTD.)

With the results of Examples shown in the Table, it was observed that the exchange-current density of an oxidation-reduction reaction was decreased by decreasing pH of a reaction system (Examples 1 to 3), by decreasing reaction temperature (Examples 1 and 4), by decreasing reducing agent concentration (Examples 1, 5, and 6), or by decreasing platinum concentration (Examples 1, 7, and 8), and that the particle size of platinum powder can thereby be decreased.

With the results of Examples 1 and Examples 9 to 11, it was found that the particle size of platinum powder can be decreased as a result of decrease in the exchange current density of an oxidation-reduction reaction wherein the exchange current density can be decreased by increasing viscosity with the addition of a macromolecular dispersing agent. Furthermore, with the results of Examples 1 and 12, it was found that the particle size of platinum powder can be changed by varying the exchange-current density of an oxidation-reduction reaction by selecting a metal compound used as the ion source of platinum even if the other conditions are the same.

Example 13

A catalyst was produced as in Example 1 except that sucrose was used instead of fructose and that the reaction temperature was 60° C. The sucrose concentration in the reaction system was 0.20 M. The exchange-current density of the reaction system was 10.0 $\mu A/cm^2$. After treating the resulting catalyst as in Example 1, the particle size of the platinum powder precipitated on carbon black was calculated to be 1.9 nm.

Example 14

A catalyst was produced as in Example 1 except that glucose was used instead of fructose and that the reaction temperature was 60° C. The glucose concentration in the reaction system was 0.20 M. The exchange-current density of the reaction system was 48.0 $\mu A/cm^2$. After treating the resulting catalyst as in Example 1, the particle size of the platinum powder precipitated on carbon black was calculated to be 5.2 nm.

Example 15

A catalyst was produced as in Example 1 except that galactose was used instead of fructose and that the reaction temperature was 60° C. The galactose concentration in the reaction system was 0.20 M. The exchange-current density of the reaction system was 16.0 $\mu A/cm^2$. After treating the resulting catalyst as in Example 1, the particle size of the platinum powder precipitated on carbon black was calculated to be 4.3 nm.

Example 16

A catalyst was produced as in Example 1 except that citric acid was used instead of fructose and that the reaction temperature was 60° C. The citric acid concentration in the reaction system was 0.20 M. The exchange-current density of the reaction system was 30.0 $\mu A/cm^2$. After treating the resulting catalyst as in Example 1, the particle size of the platinum powder precipitated on carbon black was calculated to be 16.0 nm.

Example 17

A catalyst was produced as in Example 1 except that ethylene glycol was used instead of fructose and that the reaction temperature was 60° C. The ethylene glycol concentration in the reaction system was 900 mL/L. The exchange-current density of the reaction system was 32.0 µA/cm². After treating the resulting catalyst as in Example 1, the particle size of the platinum powder precipitated on carbon black was calculated to be 4.5 nm.

Example 18

A catalyst was produced as in Example 1 except that mannose was used instead of fructose and that the reaction temperature was 60° C. The mannose concentration in the reaction system was 0.20 M. The exchange-current density of the reaction system was 12.0 µA/cm². After treating the resulting catalyst as in Example 1, the particle size of the platinum powder precipitated on carbon black was calculated to be 1.9 nm.

Example 19

A catalyst was produced as in Example 1 except that ethanol was used instead of fructose and that the reaction temperature was 60° C. The ethanol concentration in the reaction system was 900 mL/L. The exchange-current density of the reaction system was 12.0 µA/cm². After treating the resulting catalyst as in Example 1, the particle size of the platinum powder precipitated on carbon black was calculated to be 2.2 nm.

Example 20

A catalyst was produced as in Example 1 except that ascorbic acid was used instead of fructose and that the reaction temperature was 20° C. The ascorbic acid concentration in the reaction system was 0.20 M. The exchange-current density of the reaction system was 41.0 µA/cm². After treating the resulting catalyst as in Example 1, the particle size of the platinum powder precipitated on carbon black was calculated to be 20.0 nm.

Comparative Example 1

A catalyst was produced as in Example 20 except that the reaction temperature was 60° C. The exchange-current density of the reaction system was 700.0 µA/cm². After treating the resulting catalyst as in Example 1, the particle size of the platinum powder precipitated on carbon black was calculated to be 90.0 nm.

Example 21

A catalyst was produced as in Example 1 except that malic acid was used instead of fructose and that the reaction temperature was 20° C. The malic acid concentration in the reaction system was 0.20 M. The exchange-current density of the reaction system was 1.5 µA/cm². After treating the resulting catalyst as in Example 1, the particle size of the platinum powder precipitated on carbon black was calculated to be 4.8 nm.

Example 22

A catalyst was produced as in Example 21 except the reaction temperature was 60° C. The exchange-current density of the reaction system was 35.0 µA/cm². After treating the resulting catalyst as in Example 1, the particle size of the platinum powder precipitated on carbon black was calculated to be 18.0 nm.

Example 23

A catalyst was produced as in Example 1 except that tartaric acid was used instead of fructose and that the reaction temperature was 20° C. The tartaric acid concentration in the reaction system was 0.20 M. The exchange-current density of the reaction system was 2.0 µA/cm². After treating the resulting catalyst as in Example 1, the particle size of the platinum powder precipitated on carbon black was calculated to be 5.0 nm.

Example 24

A catalyst was produced as in Example 23 except the reaction temperature was 60° C. The exchange-current density of the reaction system was 40.0 µA/cm². After treating the resulting catalyst as in Example 1, the particle size of the platinum powder precipitated on carbon black was calculated to be 22.0 nm.

The results are shown in Table 2. The symbols used in the Table are as follows:

TABLE 2

| | | Metal | | | | Reaction system | | | Exchange- | Particle size of |
| | | Compound | | Reducing agent | | Reaction | | Reaction | current | platinum |
| | Carrier particle | Type | Concentration (M) | Type | Concentration (M) | temperature (° C.) | Additive pH agent | time (hr) | density (µA/cm²) | powder (nm) |
|---|---|---|---|---|---|---|---|---|---|---|
| Example 13 | CB | *1 | 0.02 | SC | 0.20 | 60 | 1.5 None | 240 | 10.0 | 1.9 |
| Example 14 | CB | *1 | 0.02 | GL | 0.20 | 60 | 1.5 None | 240 | 48.0 | 5.2 |
| Example 15 | CB | *1 | 0.02 | GA | 0.20 | 60 | 1.5 None | 240 | 16.0 | 4.3 |
| Example 16 | CB | *1 | 0.02 | Ct | 0.20 | 60 | 1.5 None | 240 | 30.0 | 16.0 |
| Example 17 | CB | *1 | 0.02 | EG | 900 mL/L | 60 | 1.5 None | 240 | 32.0 | 4.5 |
| Example 18 | CB | *1 | 0.02 | MN | 0.20 | 60 | 1.5 None | 240 | 12.0 | 1.9 |

TABLE 2-continued

|  | Carrier particle | Metal Compound | | Reducing agent | | Reaction system | | | | Exchange-current density ($\mu A/cm^2$) | Particle size of platinum powder (nm) |
|---|---|---|---|---|---|---|---|---|---|---|---|
|  |  | Type | Concentration (M) | Type | Concentration (M) | Reaction temperature (°C.) | Additive pH agent | Reaction time (hr) | | | |
| Example 19 | CB | *1 | 0.02 | Et | 900 mL/L | 60 | 1.5 None | 240 | | 12.0 | 2.2 |
| Example 20 | CB | *1 | 0.02 | As | 0.20 | 20 | 1.5 None | 240 | | 41.0 | 20.0 |
| Comparative Example 1 | CB | *1 | 0.02 | As | 0.20 | 60 | 1.5 None | 240 | | 700.0 | 90.0 |
| Example 21 | CB | *1 | 0.02 | Ma | 0.20 | 20 | 1.5 None | 240 | | 1.5 | 4.8 |
| Example 22 | CB | *1 | 0.02 | Ma | 0.20 | 60 | 1.5 None | 240 | | 35.0 | 18.0 |
| Example 23 | CB | *1 | 0.02 | Ta | 0.20 | 20 | 1.5 None | 240 | | 2.0 | 5.0 |
| Example 24 | CB | *1 | 0.02 | Ta | 0.20 | 60 | 1.5 None | 240 | | 40.0 | 22.0 |

Type of carrier particle
CB: carbon black
Type of metal compound
*1: Dinitrodiammineplatinum (II) nitric acid solution (platinum concentration: 50 g/L)
Type of reducing agent
SC: Sucrose
GL: Glucose
GA: Galactose
Ct: Citric acid
EG: Ethylene glycol
MN: Mannose
Et: Ethanol
As: Ascorbic acid
Ma: Malic acid
Ta: Tartaric acid With the results of Examples shown in the Table, it was found that the exchange-current density of an oxidation-reduction reaction can be changed by selecting a reducing agent from various compounds even if the other conditions are the same and that the particle size of platinum powder can thereby be changed. With the results of Examples 20 to 24 and Comparative Example 1, it was found that the exchange-current density of an oxidation-reduction reaction can be changed by regulating the conditions such as the reaction temperature even if the reducing agent is the same and that the particle size of platinum powder can thereby be changed. In particular, with the results of Examples 21 and Comparative Example 1, it was observed that the particle size of metal powder can be further decreased by controlling the exchange-current density of an oxidation-reduction reaction at 100 $\mu A/cm^2$ or less by regulating the conditions of the reaction system, even if a conventional reducing agent (i.e. ascorbic acid) was used (Comparative Example 1 corresponds to an example disclosed in Patent Document 3).

Comparative Example 2

A catalyst was produced as in Example 1 except that titanium trichloride was used instead of fructose and that the reaction temperature was 20° C. The titanium trichloride concentration in the reaction system was 0.20 M. The exchange-current density of the reaction system was 1800.0 $\mu A/cm^2$. After treating the resulting catalyst as in Example 1, the particle size of the platinum powder precipitated on carbon black was calculated to be 180.0 nm.

Comparative Example 3

A catalyst was produced as in Comparative Example 2 except that the reaction temperature was 60° C. The exchange-current density of the reaction system was 3800.0 $\mu A/cm^2$. After treating the resulting catalyst as in Example 1, the particle size of the platinum powder precipitated on carbon black was calculated to be 280.0 nm.

Comparative Example 4

A catalyst was produced as in Example 1 except that sodium borohydride ($NaBH_4$) was used instead of fructose and that the reaction temperature was 20° C. The sodium borohydride concentration in the reaction system was 0.20 M. The exchange-current density of the reaction system was 5300.0 $\mu A/cm^2$. After treating the resulting catalyst as in Example 1, the particle size of the platinum powder precipitated on carbon black was calculated to be 1200.0 nm.

Comparative Example 5

A catalyst was produced as in Comparative Example 4 except that the reaction temperature was 60° C. The exchange-current density of the reaction system was 12000.0 $\mu A/cm^2$. After treating the resulting catalyst as in Example 1, the particle size of the platinum powder precipitated on carbon black was calculated to be 2500.0 nm.

The results are shown in Table 3. The symbols used in the Table are as follows:

TABLE 3

| | Carrier particle | Metal Compound | | Reducing agent | | Reaction system | | | Exchange-current density ($\mu A/cm^2$) | Particle size of platinum powder (nm) |
|---|---|---|---|---|---|---|---|---|---|---|
| | | Type | Concentration (M) | Type | Concentration (M) | Reaction temperature (°C.) | Additive pH agent | Reaction time (hr) | | |
| Comparative Example 2 | CB | *1 | 0.02 | $TiCl_3$ | 0.20 | 20 | 1.5 None | 240 | 1800.0 | 180.0 |
| Comparative Example 3 | CB | *1 | 0.02 | $TiCl_3$ | 0.20 | 60 | 1.5 None | 240 | 3800.0 | 280.0 |
| Comparative Example 4 | CB | *1 | 0.02 | $NaBH_4$ | 0.20 | 20 | 1.5 None | 240 | 5300.0 | 1200.0 |
| Comparative Example 5 | CB | *1 | 0.02 | $NaBH_4$ | 0.20 | 60 | 1.5 None | 240 | 12000.0 | 2500.0 |

Type of carrier particle
CB: Carbon black
Type of metal compound
*1: Dinitrodiammineplatinum (II) nitric acid solution (platinum concentration: 50 g/L)
Type of reducing agent
$TiCl_3$: Titanium trichloride
$NaBH_4$: Sodium borohydride With the results of Comparative Examples shown in the Table, it was found that the exchange-current density of an oxidation-reduction reaction cannot be controlled to 100 $\mu A/cm^2$ or less when the reducing activity of the reducing agent is too high even if the other conditions are regulated and that consequently the particle size of the metal powder cannot be decreased.

<Platinum Powder and Production of Catalysts Using the Platinum Powder: II>

Example 25

A liquid-phase reaction-system was prepared by: mixing 12 g of γ-alumina particles having a specific surface area of 75 $m^2/g$ as carrier particles, 1 g of PEI-PO copolymer (PA0306 of EPOMIN®: NIPPON SHOKUBAI CO., LTD.) as the macromolecular dispersing agent, fructose as the reducing agent, a dinitrodiammineplatinum (II) nitric acid solution (platinum concentration: 50 g/L), and deionized water; adjusting pH at 8.5 by adding nitric acid or sodium hydroxide, if necessary; and then adding deionized water to make a total volume of 1 liter. The concentration in the reaction system of platinum was 0.2 mM and that of fructose was 0.2 M.

A catalyst was produced by precipitating platinum powder on the surfaces of γ-alumina particles by means of reaction in the reaction system maintained under conditions of a temperature of 80° C. for 6 hrs with stirring at 400 rpm by a magnetic stirrer. The exchange-current density of the reaction system was measured by the above-mentioned method to be 12.0 $\mu A/cm^2$. The viscosity of the reaction system was 0.3 mPa·s at this reaction temperature. After treating the resulting catalyst as in Example 1, the particle size of the platinum powder precipitated on the γ-alumina particles was calculated to be 2.4 nm.

Example 26

A catalyst was produced as in Example 25 except that 1 g of CELUNA D-735 (trade name of CHUKYO YUSHI CO., LTD., molecular weight: 18000) was used as a macromolecular dispersing agent instead of the PEI-PO copolymer. The exchange-current density of the reaction system was 15.0 $\mu A/cm^2$. After treating the resulting catalyst as in Example 1, the particle size of the platinum powder precipitated on the γ-alumina particles was calculated to be 3.0 nm.

Example 27

A catalyst was produced as in Example 25 except that 1 g of olefin-maleate copolymer (Polyster OMAN: NOF CORPORATION, weight-average molecular weight (Mw): about 10000) was used as the macromolecular dispersing agent instead of the PEI-PO copolymer. The exchange-current density of the reaction system was 18.0 $\mu A/cm^2$. After treating the resulting catalyst as in Example 1, the particle size of the platinum powder precipitated on the γ-alumina particles was calculated to be 3.5 nm.

Example 28

A catalyst was produced as in Example 25 except that 1 g of polyacrylic acid (weight-average molecular weight (Mw): 5000) was used as the macromolecular dispersing agent instead of the PEI-PO copolymer. The exchange-current density of the reaction system was 25.0 $\mu A/cm^2$. After treating the resulting catalyst as in Example 1, the particle size of the platinum powder precipitated on the γ-alumina particles was calculated to be 5.0 nm.

Example 29

A catalyst was produced as in Example 25 except that 1 g of polyvinyl pyrrolidone (TOKYO KASEI KOGYO CO., LTD., molecular weight: 10000) was used as the macromolecular dispersing agent instead of the PEI-PO copolymer and that glucose was used as the reducing agent instead of fructose. The glucose concentration in the reaction system was 0.2 M. The exchange-current density of the reaction system was 13.0 $\mu A/cm^2$. After treating the resulting catalyst as in Example 1, the particle size of the platinum powder precipitated on the γ-alumina particles was calculated to be 2.5 nm.

Example 30

A catalyst was produced as in Example 29 except that galactose was used instead of glucose. The galactose concentration in the reaction system was 0.2 M. The exchange-current density of the reaction system was 13.0 μA/cm². After treating the resulting catalyst as in Example 1, the particle size of the platinum powder precipitated on the γ-alumina particles was calculated to be 2.6 nm.

Example 31

A catalyst was produced as in Example 29 except that sucrose was used instead of glucose. The sucrose concentration in the reaction system was 0.2 M. The exchange-current density of the reaction system was 14.0 μA/cm². After treating the resulting catalyst as in Example 1, the particle size of the platinum powder precipitated on the γ-alumina particles was calculated to be 2.8 nm.

Example 32

A catalyst was produced as in Example 29 except that citric acid was used instead of glucose. The citric acid concentration in the reaction system was 0.2 M. The exchange-current density of the reaction system was 30.0 μA/cm². After treating the resulting catalyst as in Example 1, the particle size of the platinum powder precipitated on the γ-alumina particles was calculated to be 16 nm.

Example 33

A catalyst was produced as in Example 29 except that ethylene glycol was used instead of glucose. The ethylene glycol concentration in the reaction system was 200 mL/L. The exchange-current density of the reaction system was 20.0 μA/cm². The viscosity of the reaction system was 1.3 mPa·s at this reaction temperature. After treating the resulting catalyst as in Example 1, the particle size of the platinum powder precipitated on the γ-alumina particles was calculated to be 3.5 nm.

Example 34

A catalyst was produced as in Example 29 except that mannose was used instead of glucose. The mannose concentration in the reaction system was 0.2 M. The exchange-current density of the reaction system was 19.0 μA/cm². After treating the resulting catalyst as in Example 1, the particle size of the platinum powder precipitated on the γ-alumina particles was calculated to be 3.3 nm.

Example 35

A catalyst was produced as in Example 29 except that ethanol was used instead of glucose. The ethanol concentration in the reaction system was 200 mL/L. The exchange-current density of the reaction system was 24.0 μA/cm². The viscosity of the reaction system was 0.25 mPa·s at this reaction temperature. After treating the resulting catalyst as in Example 1, the particle size of the platinum powder precipitated on the γ-alumina particles was calculated to be 4.5 nm.

Example 36

A catalyst was produced as in Example 29 except that malic acid was used instead of glucose. The malic acid concentration in the reaction system was 0.2 M. The exchange-current density of the reaction system was 35.0 μA/cm². After treating the resulting catalyst as in Example 1, the particle size of the platinum powder precipitated on the γ-alumina particles was calculated to be 18 nm.

Example 37

A catalyst was produced as in Example 29 except that tartaric acid was used instead of glucose. The tartaric acid concentration in the reaction system was 0.2 M. The exchange-current density of the reaction system was 40.0 μA/cm². After treating the resulting catalyst as in Example 1, the particle size of the platinum powder precipitated on the γ-alumina particles was calculated to be 22 nm.

The results are shown in Table 4. The symbols used in the Table are as follows:

TABLE 4

| | | Metal Compound | | Reducing agent | | Reaction system | | | Reaction | Exchange-current | Particle size of platinum |
|---|---|---|---|---|---|---|---|---|---|---|---|
| | Carrier particle | Type | Concentration (mM) | Type | Concentration (M) | Reaction temperature (° C.) | pH | Additive agent | time (hr) | density (μA/cm²) | powder (nm) |
| Example 25 | Al₂O₃ | *1 | 0.2 | FL | 0.20 | 80 | 8.5 | *c | 6 | 12.0 | 2.4 |
| Example 26 | Al₂O₃ | *1 | 0.2 | FL | 0.20 | 80 | 8.5 | *e | 6 | 15.0 | 3.0 |
| Example 27 | Al₂O₃ | *1 | 0.2 | FL | 0.20 | 80 | 8.5 | *f | 6 | 18.0 | 3.5 |
| Example 28 | Al₂O₃ | *1 | 0.2 | FL | 0.20 | 80 | 8.5 | *g | 6 | 25.0 | 5.0 |
| Example 29 | Al₂O₃ | *1 | 0.2 | GL | 0.20 | 80 | 8.5 | *a | 6 | 13.0 | 2.5 |
| Example 30 | Al₂O₃ | *1 | 0.2 | GA | 0.20 | 80 | 8.5 | *a | 6 | 13.0 | 2.6 |
| Example 31 | Al₂O₃ | *1 | 0.2 | SC | 0.20 | 80 | 8.5 | *a | 6 | 14.0 | 2.8 |
| Example 32 | Al₂O₃ | *1 | 0.2 | Ct | 0.20 | 80 | 8.5 | *a | 6 | 30.0 | 16.0 |
| Example 33 | Al₂O₃ | *1 | 0.2 | EG | 200 mL/L | 80 | 8.5 | *a | 6 | 20.0 | 3.5 |

TABLE 4-continued

| | Carrier particle | Metal Compound | | Reducing agent | | Reaction system | | | Reaction time (hr) | Exchange-current density ($\mu A/cm^2$) | Particle size of platinum powder (nm) |
|---|---|---|---|---|---|---|---|---|---|---|---|
| | | Type | Concentration (mM) | Type | Concentration (M) | Reaction temperature (°C.) | pH | Additive agent | | | |
| Example 34 | $Al_2O_3$ | *1 | 0.2 | MN | 0.20 | 80 | 8.5 | *a | 6 | 19.0 | 3.3 |
| Example 35 | $Al_2O_3$ | *1 | 0.2 | Et | 200 mL/L | 80 | 8.5 | *a | 6 | 24.0 | 4.5 |
| Example 36 | $Al_2O_3$ | *1 | 0.2 | Ma | 0.20 | 80 | 8.5 | *a | 6 | 35.0 | 18.0 |
| Example 37 | $Al_2O_3$ | *1 | 0.2 | Ta | 0.20 | 80 | 8.5 | *a | 6 | 40.0 | 22.0 |

Type of carrier particle
$Al_2O_3$: γ-alumina particle
Type of metal compound
*1: Dinitrodiammineplatinum (II) nitric acid solution (platinum concentration: 50 g/L)
Type of reducing agent
FL: Fructose
GL: Glucose
GA: Galactose
SC: Sucrose
Ct: Citric acid
EG: Ethylene glycol
MN: Mannose
Et: Ethanol
Ma: Malic acid
Ta: Tartaric acid
Type of additive agent
*a: Polyvinyl pyrrolidone (TOKYO KASEI KOGYO CO., LTD., molecular weight: 10000)
*c: PEI-PO copolymer (PAO306 of EPOMIN ®: NIPPON SHOKUBAI CO., LTD.)
*e: CELUNDA D-735 (trade name of CHUKYO YUSHI CO., LTD., moelcular weight: 18000)
*f: Olefin-maleate copolymer (Polyester OMA ®: NOF CORPORATION, weight-average molecular weight (Mw): 10000)
*g: Polyacrylic acid (weight-average molecualr weight (Mw): 5000)

With the results of Examples shown in the Table, it was found that as in the case where carbon black is used as carrier particles, the platinum powder can also be deposited on the surfaces of the γ-alumina particles prepared as carrier particle. With the results of Examples 25 to 37, it was found that the exchange-current density of an oxidation-reduction reaction can be controlled by selecting a macromolecular dispersing agent as an additive agent or selecting a reducing agent and that thereby the particle size of the platinum powder can be controlled.

Example 38

A catalyst was produced as in Example 29 except that 12 g of γ-alumina particles (SUMITOMO CHEMICAL INDUSTRIES INC.) having a specific surface area of 150 m²/g were used as carrier particles and that fructose was used instead of glucose. The fructose concentration in the reaction system was 0.2 M. The exchange-current density of the reaction system was 12.0 μA/cm². After treating the resulting catalyst as in Example 1, the particle size of the platinum powder precipitated on the γ-alumina particles was calculated to be 2.4 nm.

Example 39

A catalyst was produced as in Example 38 except that 12 g of γ-alumina particles (ALCAN Inc.) having a specific surface area of 250 m²/g were used as carrier particles. The exchange-current density of the reaction system was 12.0 μA/cm². After treating the resulting catalyst as in Example 1, the particle size of the platinum powder precipitated on the γ-alumina particles was calculated to be 2.4 nm.

Example 40

A catalyst was produced as in Example 38 except that 12 g of titanium dioxide particles (Anatase: TITAN KOGYO KABUSHIKI KAISYA) having a specific surface area of 100 m²/g were used as carrier particles. The exchange-current density of the reaction system was 12.0 μA/cm². After treating the resulting catalyst as in Example 1, the particle size of the platinum powder precipitated on the titanium dioxide particles was calculated to be 2.4 nm.

Example 41

A catalyst was produced as in Example 38 except that 12 g of silica particles (KANTO KAGAKU CO., LTD.) having a specific surface area of 500 m²/g were used as carrier particles. The exchange-current density of the reaction system was 12.0 μA/cm². After treating the resulting catalyst as in Example 1, the particle size of the platinum powder precipitated on the silica particles was calculated to be 2.4 nm.

Example 42

A catalyst was produced as in Example 38 except that 12 g of cerium oxide particles (SHIN-ETSU CHEMICAL CO., LTD.) having a specific surface area of 165 m²/g were used as carrier particles. The exchange-current density of the reaction system was 12.0 μA/cm². After treating the resulting catalyst as in Example 1, the particle size of the platinum powder precipitated on the cerium oxide particles was calculated to be 2.4 nm.

Example 43

A catalyst was produced as in Example 38 except that 12 g of zirconium oxide particles (KANTO KAGAKU CO., LTD.) having a specific surface area of 75 m$^2$/g were used as carrier particles. The exchange-current density of the reaction system was 12.0 μA/cm$^2$. After treating the resulting catalyst as in Example 1, the particle size of the platinum powder precipitated on the zirconium oxide particles was calculated to be 2.4 nm.

Example 44

A catalyst was produced as in Example 38 except that 12 g of ceria-zirconia mixed oxide particles (Ce:Zr =1:1, solid solution) having a specific surface area of 100 m$^2$/g were used as carrier particles. The exchange-current density of the reaction system was 12.0 μA/cm$^2$. After treating the resulting catalyst as in Example 1, the particle size of the platinum powder precipitated on the ceria-zirconia mixed oxide particles was calculated to be 2.4 nm.

The results are shown in Table 5. The symbols used in the Table are as follows:

Example 46

A catalyst was produced as in Example 45 except that the pH of the reaction system was 8.0. The exchange-current density of the reaction system was 21.0 μA/cm$^2$. After treating the resulting catalyst as in Example 1, the particle size of the platinum powder precipitated on the γ-alumina particles was calculated to be 4.5 nm.

Example 47

A catalyst was produced as in Example 45 except that the pH of the reaction system was 9.0. The exchange-current density of the reaction system was 13.0 μA/cm$^2$. After treating the resulting catalyst as in Example 1, the particle size of the platinum powder precipitated on the γ-alumina particles was calculated to be 2.4 nm.

Example 48

A catalyst was produced as in Example 45 except that the pH of the reaction system was 9.5. The exchange-current density of the reaction system was 15.0 μA/cm$^2$. After treat-

TABLE 5

| | Carrier particle | | Metal Compound | | Reducing agent | | Reaction system | | | | Exchange-current density (μA/cm$^2$) | Particle size of platinum powder (nm) |
|---|---|---|---|---|---|---|---|---|---|---|---|---|
| | Type | Specific surface area | Type | Concentration (mM) | Type | Concentration (M) | Reaction temperature (°C.) | pH | Additive agent | Reaction time (hr) | | |
| Example 38 | Al$_2$O$_3$ | 150 | *1 | 0.2 | FL | 0.20 | 80 | 8.5 | *a | 6 | 12.0 | 2.4 |
| Example 39 | Al$_2$O$_3$ | 250 | *1 | 0.2 | FL | 0.20 | 80 | 8.5 | *a | 6 | 12.0 | 2.4 |
| Example 40 | TiO$_2$ | 100 | *1 | 0.2 | FL | 0.20 | 80 | 8.5 | *a | 6 | 12.0 | 2.4 |
| Example 41 | SiO$_2$ | 500 | *1 | 0.2 | FL | 0.20 | 80 | 8.5 | *a | 6 | 12.0 | 2.4 |
| Example 42 | CeO$_2$ | 165 | *1 | 0.2 | FL | 0.20 | 80 | 8.5 | *a | 6 | 12.0 | 2.4 |
| Example 43 | ZrO$_2$ | 75 | *1 | 0.2 | FL | 0.20 | 80 | 8.5 | *a | 6 | 12.0 | 2.4 |
| Example 44 | CeZrO | 100 | *1 | 0.2 | FL | 0.20 | 80 | 8.5 | *a | 6 | 12.0 | 2.4 |

Type of carrier particle
Al$_2$O$_3$: γ-alumia particle
TiO$_2$: Titanium dioxide particle
SiO$_2$: Silica particle
CeO$_2$: Cerium oxide particle
ZrO$_2$: Zirconium oxide particle
CeZrO: Ceria-zirconia mixed oxide particle
Type of metal compound
*1: Dinitrodiammineplatinum (II) nitric acid solution (platnium concentration: 50 g/L)
Type of reducing agent
FL: Fructose
Type of additive agent
*a: Polyvinyl pyrrolidone (TOKYO KASEI KOGYO CO., LTD., molecular weight: 10000)

With the results of Examples shown in the Table, it was observed that platinum powder can also deposited on the surfaces of various metal oxides as carrier particles.

Example 45

A catalyst was produced as in Example 29 except that fructose was used instead of glucose and that pH of the reaction system was 7.0. The fructose concentration in the reaction system was 0.2 M. The exchange-current density of the reaction system was 23.0 μA/cm$^2$. After treating the resulting catalyst as in Example 1, the particle size of the platinum powder precipitated on the γ-alumina particles was calculated to be 5.3 nm.

ing the resulting catalyst as in Example 1, the particle size of the platinum powder precipitated on the γ-alumina particles was calculated to be 2.7 nm.

Example 49

A catalyst was produced as in Example 45 except that the pH of the reaction system was 10.0. The exchange-current density of the reaction system was 19.0 μA/cm$^2$. After treating the resulting catalyst as in Example 1, the particle size of the platinum powder precipitated on the γ-alumina particles was calculated to be 3.3 nm.

Example 50

A catalyst was produced as in Example 29 except that fructose was used instead of glucose and that the reaction temperature was 50° C. The fructose concentration in the reaction system was 0.2 M. The exchange-current density of the reaction system was 12.0 μA/cm². After treating the resulting catalyst as in Example 1, the particle size of the platinum powder precipitated on the γ-alumina particles was calculated to be 2.3 nm.

Example 51

A catalyst was produced as in Example 50 except that the reaction temperature was 60° C. The exchange-current density of the reaction system was 12.0 μA/cm². After treating the resulting catalyst as in Example 1, the particle size of the platinum powder precipitated on the γ-alumina particles was calculated to be 2.4 nm.

Example 52

A catalyst was produced as in Example 50 except that the reaction temperature was 70° C. The exchange-current density of the reaction system was 12.0 μA/cm². After treating the resulting catalyst as in Example 1, the particle size of the platinum powder precipitated on the γ-alumina particles was calculated to be 2.4 nm.

Example 53

A catalyst was produced as in Example 50 except that the reaction temperature was 90° C. The exchange-current density of the reaction system was 13.0 μA/cm². After treating the resulting catalyst as in Example 1, the particle size of the platinum powder precipitated on the γ-alumina particles was calculated to be 2.5 nm.

Example 54

A catalyst was produced as in Example 29 except that fructose was used instead of glucose and that hydrogen hexachloroplatinate (IV) hexahydrate ($H_2[PtCl_6] \cdot 6H_2O$) was used instead of the dinitrodiammineplatinum (II) nitric acid solution. The platinum concentration in the reaction system was 0.2 mM. The fructose concentration in the reaction system was 0.2 M. The exchange-current density of the reaction system was 22.0 μA/cm². After treating the resulting catalyst as in Example 1, the particle size of the platinum powder precipitated on the γ-alumina particles was calculated to be 3.8 nm.

The results are shown in Table 6. The symbols used in the Table are as follows:

TABLE 6

| | Carrier particle | Metal Compound Type | Metal Compound Concentration (mM) | Reducing agent Type | Reducing agent Concentration (M) | Reaction system Reaction temperature (° C.) | Reaction system pH | Reaction system Additive agent | Reaction time (hr) | Exchange-current density (μA/cm²) | Particle size of platinum powder (nm) |
|---|---|---|---|---|---|---|---|---|---|---|---|
| Example 45 | $Al_2O_3$ | *1 | 0.2 | FL | 0.20 | 80 | 7.0 | *a | 6 | 23.0 | 5.3 |
| Example 46 | $Al_2O_3$ | *1 | 0.2 | FL | 0.20 | 80 | 8.0 | *a | 6 | 21.0 | 4.5 |
| Example 47 | $Al_2O_3$ | *1 | 0.2 | FL | 0.20 | 80 | 9.0 | *a | 6 | 13.0 | 2.4 |
| Example 48 | $Al_2O_3$ | *1 | 0.2 | FL | 0.20 | 80 | 9.5 | *a | 6 | 15.0 | 2.7 |
| Example 49 | $Al_2O_3$ | *1 | 0.2 | FL | 0.20 | 80 | 10.0 | *a | 6 | 19.0 | 3.3 |
| Example 50 | $Al_2O_3$ | *1 | 0.2 | FL | 0.20 | 50 | 8.5 | *a | 6 | 12.0 | 2.3 |
| Example 51 | $Al_2O_3$ | *1 | 0.2 | FL | 0.20 | 60 | 8.5 | *a | 6 | 12.0 | 2.4 |
| Example 52 | $Al_2O_3$ | *1 | 0.2 | FL | 0.20 | 70 | 8.5 | *a | 6 | 12.0 | 2.4 |
| Example 53 | $Al_2O_3$ | *1 | 0.2 | FL | 0.20 | 90 | 8.5 | *a | 6 | 13.0 | 2.5 |
| Example 54 | $Al_2O_3$ | *2 | 0.2 | FL | 0.20 | 80 | 8.5 | *a | 6 | 22.0 | 3.8 |

Type of carrier particle
$Al_2O_3$: γ-alumina particle
Type of metal compound
*1: Dinitrodiammineplatinum (II) nitric acid solution (platinum concentration: 50 g/L)
*2: Hydrogen hexachloroplatinate (IV) hexahydrate
Type of reucing agent
FL: Fructose
Type of additive agent
*a: Polyvinyl pyrrolidone (TOKYO KASEI KOGYO CO., LTD., moelcualr weight: 10000)

With the results of Examples 45 to 49 and the results of Examples 25 and 38 to 43 described earlier, it was found that the exchange-current density of the oxidation-reduction reaction can be decreased by adjusting the pH of the reaction system within the range of 8.5 to 9.5 and that thereby the particle size of the platinum powder can be decreased. With the results of Examples 50 to 53 and the results of Examples 25 and 38 to 43 described earlier, it was found that the exchange-current density of an oxidation-reduction reaction can be decreased by lowering the reaction temperature and that thereby the particle size of the platinum powder can be decreased. With the results of Example 54 and the results of Examples 25 and 38 to 43 described earlier, it was found that the exchange-current density of the oxidation-reduction reaction can be decreased by using the dinitrodiammineplatinum (II) nitric acid solution as the metal compound and that thereby the particle size of the platinum powder can be decreased.

Example 55

A liquid-phase reaction-system was prepared by: mixing 12 g of γ-alumina particles having a specific surface area of 75 $m^2/g$ as carrier particles, 1 g of polyvinyl pyrrolidone (TOKYO KASEI KOGYO CO., LTD., molecular weight: 10000) as the macromolecular dispersing agent, fructose and ethanol as reducing agents, a dinitrodiammineplatinum (II) nitric acid solution (platinum concentration: 50 g/L), and deionized water; adjusting the pH at 8.5 by adding nitric acid or sodium hydroxide, if necessary; and adding deionized water to make a total volume of 1 liter. The platinum concentration in the reaction system was 0.2 mM, the fructose concentration was 0.2 M, and the ethanol concentration was 200 mL/L.

A catalyst was produced by subjecting this reaction system to reaction under conditions of a reaction temperature of 80° C. for 6 hrs with stirring at 400 rpm by a magnetic stirrer so that platinum powder is deposited on the surfaces of the γ-alumina particles. The exchange-current density of the reaction system measured by the above-mentioned method was 12.0 $\mu A/cm^2$. The viscosity of the reaction system was 0.3 mPa·s at this reaction temperature. After treating the resulting catalyst as in Example 1, the particle size of the platinum powder precipitated on the γ-alumina particles was calculated to be 2.4 nm. The amount of supported platinum of the resulting catalyst was measured by inductively coupled plasma spectrometry (ICP), and from the amount and the platinum concentration in the reaction system, the ratio of the platinum powder deposited on the surfaces of the carrier particles was calculated to be 97.5 mol %.

Example 56

A catalyst was produced as in Example 55 except that the ethanol concentration was 100 mL/L. The exchange-current density of the reaction system was 12.0 $\mu A/cm^2$. After treating the resulting catalyst as in Example 1, the particle size of the platinum powder precipitated on the γ-alumina particles was calculated to be 2.4 nm. The ratio of the supported platinum powder was 84.3 mol %.

Example 57

A catalyst was produced as in Example 55 except that fructose only, without ethanol, was used as the reducing agent. The exchange-current density of the reaction system was 13.0 $\mu A/cm^2$. After treating the resulting catalyst as in Example 1, the particle size of the platinum powder precipitated on the γ-alumina particles was calculated to be 2.6 nm. The ratio of supported platinum powder was 55.2 mol %.

Example 58

A catalyst was produced as in Example 55 except that methanol was used instead of ethanol. The methanol concentration was 200 mL/L. The exchange-current density of the reaction system was 11.0 $\mu A/cm^2$. After treating the resulting catalyst as in Example 1, the particle size of the platinum powder precipitated on the γ-alumina particles was calculated to be 2.3 nm. The ratio of supported platinum powder was 98.5 mol %.

Example 59

A catalyst was produced as in Example 55 except that isopropyl alcohol was used instead of ethanol. The isopropyl alcohol concentration was 200 mL/L. The exchange-current density of the reaction system was 16.0 $\mu A/cm^2$. After treating the resulting catalyst as in Example 1, the particle size of the platinum powder precipitated on the γ-alumina particles was calculated to be 2.7 nm. The ratio of supported platinum powder was 99.9 mol %.

The results are shown in Table 7. The symbols used in the Table are as follows:

TABLE 7

|  | Carrier Particle | Metal Compound | | Reducing agent | | Reaction system | | | | Exchange-current density ($\mu A/cm^2$) | Particle size of platinum powder (nm) | Ratio of supported platinum powder (mol %) |
| --- | --- | --- | --- | --- | --- | --- | --- | --- | --- | --- | --- | --- |
|  |  | Type | Concentration (mM) | Type | Concentration (M) | Reaction temperature (° C.) | pH | Additive agent | Reaction time (hr) |  |  |  |
| Example 55 | $Al_2O_3$ | *1 | 0.2 | FL Et | 0.20 200 mL/L | 80 | 8.5 | *a | 6 | 12.0 | 2.4 | 97.5 |
| Example 56 | $Al_2O_3$ | *1 | 0.2 | FL Et | 0.20 100 mL/L | 80 | 8.5 | *a | 6 | 12.0 | 2.4 | 84.3 |
| Example 57 | $Al_2O_3$ | *1 | 0.2 | FL Et | 0.20 — | 80 | 8.5 | *a | 6 | 13.0 | 2.6 | 55.2 |
| Example 58 | $Al_2O_3$ | *1 | 0.2 | FL Me | 0.20 200 mL/L | 80 | 8.5 | *a | 6 | 11.0 | 2.3 | 98.5 |

TABLE 7-continued

| | Carrier Particle | Metal Compound | | Reducing agent | | Reaction system | | | Reaction time (hr) | Exchange-current density (μA/cm²) | Particle size of platinum powder (nm) | Ratio of supported platinum powder (mol %) |
|---|---|---|---|---|---|---|---|---|---|---|---|---|
| | | Type | Concentration (mM) | Type | Concentration (M) | Reaction temperature (°C.) | pH | Additive agent | | | | |
| Example 59 | Al₂O₃ | *1 | 0.2 | FL iPr | 0.20 200 mL/L | 80 | 8.5 | *a | 6 | 16.0 | 2.7 | 99.9 |

Type of carrier particle
Al$_2$O$_3$: γ-alumina particle
Type of metal compound
*1: Dinitrodiammineplatinum (II) nitric acid solution (platinum concentration: 50 g/L)
Type of reducing agent
FL: Fructose
Et: Ethanol
Me: Methanol
iPr: Isopropyl alcohol
Type of additive agent
*a: Polyvinyl pyrrolidone (TOKYO KASEI KOGYO CO., LTD., molecular weight: 10000)

With the results of Examples shown in the Table, it was observed that by using a combination of an alcohol and other reducing agent, the ratio of platinum powder deposited on the surfaces of the carrier particles can be improved while a very small particle size of platinum powder can be maintained.

Example 60

A liquid-phase reaction-system was prepared by: mixing 60 g of titanium nitride (TiN) particles having a specific surface area of 10 m²/g as carrier particles, 1 g of polyvinyl pyrrolidone (TOKYO KASEI KOGYO CO., LTD., molecular weight: 10000) as the macromolecular dispersing agent, fructose as the reducing agent, a dinitrodiammineplatinum (II) nitric acid solution (platinum concentration: 50 g/L), and deionized water; adjusting pH at 8.5 by adding nitric acid or sodium hydroxide, if necessary; and adding deionized water to make a total volume of 1 liter. The platinum concentration in the reaction system was 0.2 mM, the fructose concentration was 0.2 M.

A catalyst was produced by causing reaction so as to precipitate platinum powder on the surfaces of the titanium nitride particles in a manner such that the reaction system was maintained under conditions of a reaction temperature of 80° C. for 6 hrs while it was stirred at 400 rpm with a magnetic stirrer. The exchange-current density of the reaction system measured by the above-mentioned method was 15.0 μA/cm². The viscosity of the reaction system was 0.3 mPa·s at this reaction temperature. After treating the resulting catalyst as in Example 1, the particle size of the platinum powder precipitated on the titanium nitride particles was calculated to be 2.8 nm.

Example 61

A catalyst was produced as in Example 60 except that 60 g of silicon nitride (Si$_3$N$_4$) particles having a specific surface area of 10 m²/g were used as carrier particles. The exchange-current density of the reaction system was 15.0 μA/cm2. After treating the resulting catalyst as in Example 1, the particle size of the platinum powder precipitated on the silicon nitride particles was calculated to be 2.8 nm.

Example 62

A catalyst was produced as in Example 60 except that 60 g of silver sulphide (Ag$_2$S) particles having a specific surface area of 10 m²/g were used as carrier particles. The exchange-current density of the reaction system was 15.0 μA/cm². After treating the resulting catalyst as in Example 1, the particle size of the platinum powder precipitated on the silver sulphide particles was calculated to be 2.8 nm.

The results are shown in Table 8. The symbols used in the Table are as follows:

TABLE 8

| | Carrier Particle | Metal Compound | | Reducing agent | | Reaction system | | | Reaction time (hr) | Exchange-current density (μM/cm²) | Particle size of platinum powder (nm) |
|---|---|---|---|---|---|---|---|---|---|---|---|
| | | Type | Concentration (mM) | Type | Concentration (M) | Reaction temperature (°C.) | pH | Additive agent | | | |
| Example 60 | TiN | *1 | 0.2 | FL | 0.20 | 80 | 8.5 | *a | 6 | 15.0 | 2.8 |
| Example 61 | Si₃N₄ | *1 | 0.2 | FL | 0.20 | 80 | 8.5 | *a | 6 | 15.0 | 2.8 |

TABLE 8-continued

| | Carrier Particle | Metal Compound | | Reducing agent | | Reaction system | | | Reaction time (hr) | Exchange- current density ($\mu$A/cm$^2$) | Particle size of platinum powder (nm) |
|---|---|---|---|---|---|---|---|---|---|---|---|
| | | Type | Concentration (mM) | Type | Concentration (M) | Reaction temperature (°C.) | pH | Additive agent | | | |
| Example 62 | Ag$_2$S | *1 | 0.2 | FL | 0.20 | 80 | 8.5 | *a | 6 | 15.0 | 2.8 |

Type of carrier particle
TiN: Titanium nitride particle
Si$_3$N$_4$: silicon nitride particle
Ag$_2$S: Silver sulphide particle
Type of metal compound
*1: Dinitrodiammineplatinum (II) nitric acid solution (platinum concentration: 50 g/L)
Type of reducing agent
FL: Fructose
Type of additive agent
*a: Polyvinyl pyrrolidone (TOKYO KASEI KOGYO CO., LTD., molecular weight: 1000)

From the results of Examples shown in the Table, it was found that platinum powder can also be deposited on the surfaces of various metal compounds used as carrier particles.

Comparative Example 6

A catalyst was produced as in Example 29 except that ascorbic acid was used instead of glucose. The ascorbic acid concentration in the reaction system was 0.2 M. The exchange-current density of the reaction system was 800.0 $\mu$A/cm$^2$. After treating the resulting catalyst as in Example 1, the particle size of the platinum powder precipitated on the γ-alumina particles was calculated to be 30.5 nm.

Comparative Example 7

A catalyst was produced as in Example 29 except that titanium trichloride was used instead of glucose. The titanium trichloride concentration in the reaction system was 0.2 M. The exchange-current density of the reaction system was 2400.0 $\mu$A/cm$^2$. After treating the resulting catalyst as in Example 1, the particle size of the platinum powder precipitated on the γ-alumina particles was calculated to be 150.0 nm.

Comparative Example 8

A catalyst was produced as in Example 29 except that sodium hypophosphite (NaH$_2$PO$_2$H$_2$O) was used instead of glucose. The sodium hypophosphite concentration in the reaction system was 0.2 M. The exchange-current density of the reaction system was 7200.0 $\mu$A/cm$^2$. After treating the resulting catalyst as in Example 1, the particle size of the platinum powder precipitated on the γ-alumina particles was calculated to be 1500.0 nm.

Comparative Example 9

A catalyst was produced as in Example 29 except that sodium borohydride (NaBH$_4$) was used instead of glucose. The sodium borohydride concentration in the reaction system was 0.2 M. The exchange-current density of the reaction system was 15000.0 $\mu$A/cm$^2$. After treating the resulting catalyst as in Example 1, the particle size of the platinum powder precipitated on the γ-alumina particles was calculated to be 3000.0 nm.

The results are shown in Table 9. The symbols used in the Table are as follows:

TABLE 9

| | Carrier particle | Metal Compound | | Reducing agent | | Reaction system | | | Reaction time (hr) | Exchange- current density ($\mu$A/cm$^2$) | Particle size of platinum powder (nm) |
|---|---|---|---|---|---|---|---|---|---|---|---|
| | | Type | Concentration (mM) | Type | Concentration (M) | Reaction temperature (°C.) | pH | Additive agent | | | |
| Comparative Example 6 | Al$_2$O$_3$ | *1 | 0.2 | As | 0.20 | 80 | 8.5 | *a | 6 | 800.0 | 30.5 |
| Comparative Example 7 | Al$_2$O$_3$ | *1 | 0.2 | TiCl$_3$ | 0.20 | 80 | 8.5 | *a | 6 | 2400.0 | 150.0 |
| Comparative Example 8 | Al$_2$O$_3$ | *1 | 0.2 | NaH$_2$PO$_2$ | 0.20 | 80 | 8.5 | *a | 6 | 7200.0 | 1500.0 |
| Comparative Example 9 | Al$_2$O$_3$ | *1 | 0.2 | NaBH$_4$ | 0.20 | 80 | 8.5 | *a | 6 | 15000.0 | 3000.0 |

Type of carrier particle
Al$_2$O$_3$: γ-alumina particle
Type of metal compound
*1: Dinitrodiammineplatinum (II) nitric acid solution (platinum concentration: 50 g/L)
Type of reducing agent
As: Ascorbic acid
TiCl$_3$: Titanium trichloride
NaH$_2$PO$_2$: Sodium hypophosphite
NaBH$_4$: Sodium borohydride With the results of Comparative Examples shown in the Table, it was found that the exchange-current density of the oxidation-reduction reaction cannot be controlled to 100 µA/cm2 or less even if the other conditions were regulated when the reducing activity of the reducing agent was too high and that consequently the particle size of the metal powder cannot be decreased.

<Various Types of Platinum-Group Metal Powders and Production of Catalysts Using the Same>

Example 63

A liquid-phase reaction-system was prepared by: mixing 12 g of γ-alumina particles having a specific surface area of 75 m$^2$/g as carrier particles, 1 g of polyvinyl pyrrolidone (TOKYO KASEI KOGYO CO., LTD., molecular weight: 10000), fructose as the reducing agent, a palladium (II) chloride (PdCl$_2$) solution, and deionized water; adjusting the pH at 8.5 by adding nitric acid or sodium hydroxide, if necessary; and adding deionized water to make a total volume of 1 liter. The palladium concentration in the reaction system was 0.2 mM, and the fructose concentration was 0.2 M.

A catalyst was produced by subjecting this reaction system to reaction under conditions of a reaction temperature of 80° C. for 6 hrs with stirring at 400 rpm by a magnetic stirrer so that palladium powder is deposited on the surfaces of the γ-alumina particles. The exchange-current density of the reaction system measured by the above-mentioned method was 21.0 µA/cm$^2$. The viscosity of the reaction system was 0.3 mPa·s at this reaction temperature. After treating the resulting catalyst as in Example 1, the particle size of the palladium powder precipitated on the γ-alumina particles was calculated to be 3.3 nm.

Example 64

A catalyst was produced as in Example 63 except that hydrogen hexachloroiridium (III) hexahydrate (2(IrCl$_6$).6H$_2$O) was used instead of the palladium (II) chloride solution. The iridium concentration in the reaction system was 0.2 mM. The exchange-current density of the reaction system was 23.0 µA/cm$^2$. After treating the resulting catalyst as in Example 1, the particle size of the iridium powder precipitated on the γ-alumina particles was calculated to be 3.5 nm.

Example 65

A catalyst was produced as in Example 63 except that a rhodium (III) chloride (RhCl$_3$.3H$_2$O) solution was used instead of the palladium (II) chloride solution. The rhodium concentration in the reaction system was 0.2 mM. The exchange-current density of the reaction system was 21.0 µA/cm$^2$. After treating the resulting catalyst as in Example 1, the particle size of the rhodium powder precipitated on the γ-alumina particles was calculated to be 3.3 nm.

Example 66

A catalyst was produced as in Example 63 except that a ruthenium (III) nitrate (Ru(NO$_3$)$_3$) solution was used instead of the palladium (II) chloride solution. The ruthenium concentration in the reaction system was 0.2 mM. The exchange-current density of the reaction system was 22.0 µA/cm$^2$. After treating the resulting catalyst as in Example 1, the particle size of the ruthenium powder precipitated on the γ-alumina particles was calculated to be 3.2 nm.

The results are shown in Table 10. The symbols used in the Table are as follows:

TABLE 10

| | | Metal Compound | | Reducing agent | | Reaction system | | | | Exchange-current density (µA/cm$^2$) | Particle size of platinum powder (nm) |
|---|---|---|---|---|---|---|---|---|---|---|---|
| | Carrier particle | Type | Concentration (mM) | Type | Concentration (M) | Reaction temperature (° C.) | pH | Additive agent | Reaction time (hr) | | |
| Example 63 | Al$_2$O$_3$ | *3 | 0.2 | FL | 0.20 | 80 | 8.5 | *a | 6 | 21.0 | 3.3 |
| Example 64 | Al$_2$O$_3$ | *4 | 0.2 | FL | 0.20 | 80 | 8.5 | *a | 6 | 23.0 | 3.5 |
| Example 65 | Al$_2$O$_3$ | *5 | 0.2 | FL | 0.20 | 80 | 8.5 | *a | 6 | 21.0 | 3.3 |
| Example 66 | Al$_2$O$_3$ | *6 | 0.2 | FL | 0.20 | 80 | 8.5 | *a | 6 | 22.0 | 3.2 |

Type of carrier particle
Al$_2$O$_3$: γ-alumina particle
Type of metal compound
*3: Palladium (II) chloride solution
*4: Hydrogen hexachloroiridium (III) hexahydrate
*5: Rhodium (III) chloride solution
*6: Ruthenium (III) nitrate solution
Type of reducing agent
FL: Fructose
Type of additive agent
*a: Polyvinyl pyrrolidone (TOKYO KASEI KOGYO CO., LTD., molecular weight: 10000)

With the results of Examples shown in the Table, it was found that the various types of platinum-group metal powders can also be deposited on the surfaces of the carrier particles as in the case of platinum powder.

<Production of Silver Powder>

Example 67

A silver nitrate ammonia solution was prepared by dissolving silver nitrate in deionized water and then adding aqueous ammonia thereto so as to adjust pH to 11. Polyvinyl pyrrolidone (K30 grade: WAKO PURE CHEMICAL IND., LTD.) as a macromolecular dispersing agent was completely dissolved in the silver nitrate ammonia solution, and then a solution which was prepared by dissolving fructose as a reducing agent in deionized water was added. Thus, a liquid-phase reaction-system was prepared. The silver concentration in the reaction system was 26 g/L, the fructose concentration was 50 g/L, and polyvinyl pyrrolidone concentration was 10 g/L.

Subsequently, a yellow colloidal silver solution showing plasmon absorption was produced by subjecting the reaction system to reaction under conditions of a reaction temperature of 10° C. for 3 hrs while it was stirred at 1000 rpm with a magnetic stirrer so as to precipitate silver powder. The exchange-current density of the reaction system measured by the above-mentioned method was 2.0 µA/cm$^2$. The viscosity of the reaction system was 1 mPa·s at this reaction temperature, and the pH was 8.

The resulting colloidal silver solution was repeatedly centrifuged at 20000 G for 20 min to remove impurities that were lighter than the silver powder particles. Then, the silver powder was washed with deionized water. A sharp peak in the particle-size distribution was recognized at a point of 5 nm as a result of the measurement with a particle-size distribution analyzer (Product No. UPA150EX of Microtrac: NIKKISO CO., LTD.) utilizing a laser Doppler method.

Example 68

A colloidal silver solution was produced as in Example 67 except that the reaction temperature was 30° C. The exchange-current density of the reaction system was 2.0 µA/cm$^2$. The viscosity of the reaction system was 1 mPa·s at this reaction temperature, and the pH was 8. After treating the resulting colloidal silver solution in the same manner as in Example 67, the particle-size distribution was measured. As a result, a sharp peak was recognized at a point of 15 nm.

Example 69

A colloidal silver solution was produced as in Example 67 except that the reaction temperature was 60° C. The exchange-current density of the reaction system was 20.0 µA/cm$^2$. The viscosity of the reaction system was 1 mPa·s at this reaction temperature, and the pH was 8. After treating the resulting colloidal silver solution in the same manner as in Example 67, the particle-size distribution was measured. As a result, a sharp peak was recognized at a point of 25 nm.

Example 70

A colloidal silver solution was produced as in Example 67 except that the silver nitrate concentration in the reaction system was 5.2 g/L, that the fructose concentration as a reducing agent in the reaction system was 10 g/L, and that the reaction temperature was 60° C. The exchange-current density of the reaction system was 18.0 µA/cm$^2$. The viscosity of the reaction system was 1 mPa·s at this reaction temperature, and the pH was 8. After treating the resulting colloidal silver solution in the same manner as in Example 67, the particle-size distribution was measured. As a result, a sharp peak was recognized at a point of 25 nm.

Example 71

A colloidal silver solution was produced as in Example 67 except that the pH of the silver nitrate ammonia solution was 12 and that the reaction temperature was 60° C. The exchange-current density of the reaction system was 40.0 µA/cm$^2$. The viscosity of the reaction system was 1 mPa·s at this reaction temperature, and the pH was 8.5. After treating the resulting colloidal silver solution in the same manner as in Example 67, the particle-size distribution was measured. As a result, a sharp peak was recognized at a point of 40 nm.

Example 72

A colloidal silver solution was produced as in Example 67 except that silver methane sulfonate was used instead of silver nitrate and that the reaction temperature was 60° C. The silver concentration in the reaction system was 26 g/L. The exchange-current density of the reaction system was 75.0 µA/cm$^2$. The viscosity of the reaction system was 1 mPa·s at this reaction temperature, and the pH was 3. After treating the resulting colloidal silver solution in the same manner as in Example 67, the particle-size distribution was measured. As a result, a sharp peak was recognized at a point of 30 nm.

Comparative Example 10

A colloidal silver solution was produced as in Example 67 except that the addition of aqueous ammonia was omitted (the pH of the solution was 6.5) after dissolving silver nitrate in deionized water, and that the reaction temperature was 60° C. The exchange-current density of the reaction system was 120.0 µA/cm$^2$. The viscosity of the reaction system was 1 mPa·s at this reaction temperature, and the pH was 7.5. After treating the resulting colloidal silver solution in the same manner as in Example 67, the particle-size distribution was measured. As a result, a broad peak was recognized centering at a point of 250 nm.

Example 73

A colloidal silver solution was produced as in Example 67 except that ascorbic acid was used instead of fructose, that the reaction temperature was 5° C., and that the reaction time was 0.5 hrs. The ascorbic acid concentration in the reaction system was 26 g/L. The exchange-current density of the reaction system was 70.0 µA/cm$^2$. The viscosity of the reaction system was 1 mPa·s at this reaction temperature, and the pH was 8. After treating the resulting colloidal silver solution in the same manner as in Example 67, the particle-size distribution was measured. As a result, a sharp peak was recognized at a point of 35 nm.

Example 74

A colloidal silver solution was produced as in Example 73 except that the reaction temperature was 30° C. The exchange-current density of the reaction system was 90.0 µA/cm$^2$. The viscosity of the reaction system was 1 mPa·s at this reaction temperature, and the pH was 8. After treating the resulting colloidal silver solution in the same manner as in Example 67, the particle-size distribution was measured. As a result, a sharp peak was recognized at a point of 40 nm.

Comparative Example 11

A colloidal silver solution was produced as in Example 73 except that the reaction temperature was 60° C. The exchange-current density of the reaction system was 240.0 µA/cm$^2$. The viscosity of the reaction system was 1 mPa·s at this reaction temperature, and the pH was 8. After treating the resulting colloidal silver solution in the same manner as in Example 67, the particle-size distribution was measured. As a result, a broad peak was recognized centering at a point of 80 nm.

The results are shown in Table 11. The symbols used in the Table are as follows:

reaction temperature was 60° C., and that the reaction time was 1 hr. The mannose concentration in the reaction system was 50 g/L. The exchange-current density of the reaction system was 15.0 μA/cm². The viscosity of the reaction system was 1 mPa·s at this reaction temperature, and the pH was 8. After treating the resulting colloidal silver solution in the

TABLE 11

| | Metal Compound | | Reducing agent | | Reaction system | | | | | | Exchange-current density (μA/cm²) | Particle size of silver powder (nm) |
|---|---|---|---|---|---|---|---|---|---|---|---|---|
| | Type | Concentration (g/L) | Type | Concentration (g/L) | Reaction temperature (° C.) | Additive agent | pH (#1) | pH (#2) | Viscosity (mPa · s) | Reaction time (hr) | | |
| Example 67 | AgNO$_3$ | 26 | FL | 50 | 10 | NH$_3$ *d | 11 | 8 | 1 | 3 | 2.0 | 5 |
| Example 68 | AgNO$_3$ | 26 | FL | 50 | 30 | NH$_3$ *d | 11 | 8 | 1 | 3 | 2.0(?) | 15 |
| Example 69 | AgNO$_3$ | 26 | FL | 50 | 60 | NH$_3$ *d | 11 | 8 | 1 | 3 | 20.0 | 25 |
| Example 70 | AgNO$_3$ | 5.2 | FL | 10 | 60 | NH$_3$ *d | 11 | 8 | 1 | 3 | 18.0 | 25 |
| Example 71 | AgNO$_3$ | 26 | FL | 50 | 60 | NH$_3$ *d | 12 | 8.5 | 1 | 3 | 40.0 | 40 |
| Example 72 | MS-Ag | 26 | FL | 50 | 60 | NH$_3$ *d | 11 | 3 | 1 | 3 | 75.0 | 30 |
| Comparative Example 10 | AgNO$_3$ | 26 | FL | 50 | 60 | None *d | 6.5 | 7.5 | 1 | 3 | 120.0 | 250 |
| Example 73 | AgNO$_3$ | 26 | As | 26 | 5 | NH$_3$ *d | 11 | 8 | 1 | 0.5 | 70.0 | 35 |
| Example 74 | AgNO$_3$ | 26 | As | 26 | 30 | NH$_3$ *d | 11 | 8 | 1 | 0.5 | 90.0 | 40 |
| Comparative Example 11 | AgNO$_3$ | 26 | As | 26 | 60 | NH$_3$ *d | 11 | 8 | 1 | 0.5 | 240.0 | 80 |

Type of metal compound
AgNO$_3$: Silver nitrate
MS-Ag: Silver mathanesulfonate
Type of reducing agent
FL: Fructose
As: Ascorbic acid
Type of additive agent
NH$_3$: Aqueous ammonia
*d: Polyvinyl pyrrolidone (K30 grade: WAKO PURE CHEMICAL IND., LTD.)
pH
1: pH of the silver nitrate ammonia solution
2: pH of the entire reaction system With the results of Examples shown in the Table, it was found that the exchange-current density of an oxidation-reduction reaction can be decreased by decreasing reaction temperature (Examples 67 to 69, Examples 73 and 74, and Comparative Example 11) or decreasing pH of the reaction system (Examples 67 and 71) and that thereby the particle size of silver powder can be decreased. With the results of Examples 69 and 70, it was found that the exchange-current density of an oxidation-reduction reaction and a particle size of silver powder can be maintained at substantially the same level when both concentrations of silver and the reducing agent are decreased.

With the results of Example 67 and Comparative Example 10, it was found that the exchange-current density of an oxidation-reduction reaction can be decreased in the case where the silver ions in the liquid phase are stabilized by forming a complex with ammonia than in the case where the silver ions are in an exposed state and that thereby the particle size of the silver powder can be decreased.

Furthermore, with the results of Examples 67 and 72, it was found that the exchange-current density of an oxidation-reduction reaction can be changed by selecting a different compound used as a silver ion source even if the other conditions are the same and that thereby the particle size of silver powder can be changed.

Example 75

A colloidal silver solution was produced as in Example 67 except that mannose was used instead of fructose, that the same manner as in Example 67, the particle-size distribution was measured. As a result, a sharp peak was recognized at a point of 8 nm.

Example 76

A colloidal silver solution was produced as in Example 67 except that ethanol was used instead of fructose and that the reaction temperature was 30° C. The ethanol concentration in the reaction system was 5 g/L. The exchange-current density of the reaction system was 20.0 μL/cm². The viscosity of the reaction system was 1 mPa·s at this reaction temperature, and the pH was 8. After treating the resulting colloidal silver solution in the same manner as in Example 67, the particle-size distribution was measured. As a result, a sharp peak was recognized at a point of 35 nm.

Example 77

A colloidal silver solution was produced as in Example 67 except that malic acid was used instead of fructose, that the reaction temperature was 25° C., and that the reaction time was 1.5 hrs. The malic acid concentration in the reaction system was 13 g/L. The exchange-current density of the reaction system was 95.0 μA/cm². The viscosity of the reaction system was 1 mPa·s at this reaction temperature, and the pH was 8. After treating the resulting colloidal silver solution in the same manner as in Example 67, the particle-size distribution was measured. As a result, a sharp peak was recognized at a point of 28 nm.

Comparative Example 12

A colloidal silver solution was produced as in Example 77 except that the reaction temperature was 80° C. The exchange-current density of the reaction system was 330.0 µA/cm². The viscosity of the reaction system was 1 mPa·s at this reaction temperature, and the pH was 8. After treating the resulting colloidal silver solution in the same manner as in Example 67, the particle-size distribution was measured. As a result, a broad peak was recognized centering at a point of 85 nm.

Example 78

A colloidal silver solution was produced as in Example 67 except that glutathione was used instead of fructose and that the reaction temperature was 60° C. The glutathione concentration in the reaction system was 30 g/L. The exchange-current density of the reaction system was 88.0 µA/cm². The viscosity of the reaction system was 1 mPa·s at this reaction temperature, and the pH was 8. After treating the resulting colloidal silver solution in the same manner as in Example 67, the particle-size distribution was measured. As a result, a sharp peak was recognized at a point of 38 nm.

Comparative Example 13

A colloidal silver solution was produced as in Example 78 except that the reaction temperature was 80° C. The exchange-current density of the reaction system was 290.0 µA/cm². The viscosity of the reaction system was 1 mPa·s at this reaction temperature, and the pH was 8. After treating the resulting colloidal silver solution in the same manner as in Example 67, the particle-size distribution was measured. As a result, a broad peak was recognized centering at a point of 260 nm.

The results are shown in Table 12. The symbols used in the Table are as follows:

With the results of Examples shown in the Table, it was found that even if other conditions are the same, the exchange-current density of the oxidation-reduction reaction can be changed by selecting a reducing agent from various compounds and that thereby the particle size of silver powder can be changed. With the results of Example 77 and Comparative Example 12 and with the results of Example 78 and Comparative Example 13, it was found that even in the case where a conventional reducing agent is used, the particle size of metal powder can be further decreased if the exchange-current density of the oxidation-reduction reaction is controlled to 100 µA/cm2 or less by regulating conditions such as the reaction temperature.

Comparative Example 14

A colloidal silver solution was produced as in Example 67 except that formalin was used instead of fructose and that the reaction temperature was 60° C. The formalin concentration in the reaction system was 5 g/L. The exchange-current density of the reaction system was 580.0 µA/cm². The viscosity of the reaction system was 1 mPa·s at this reaction temperature, and the pH was 8. After treating the resulting colloidal silver solution in the same manner as in Example 67, the particle-size distribution was measured. As a result, a broad peak was recognized centering at a point of 125 nm.

Comparative Example 15

A colloidal silver solution was produced as in Example 67 except that sodium borohydride was used instead of fructose and that the reaction temperature was 60° C. The sodium borohydride concentration in the reaction system was 4 g/L. The exchange-current density of the reaction system was 1800.0 µA/cm². The viscosity of the reaction system was 1

TABLE 12

|  | Metal Compound | | Reducing agent | | Reaction system | | | | | | Exchange-current density (µA/cm²) | Particle size of silver powder (nm) |
| --- | --- | --- | --- | --- | --- | --- | --- | --- | --- | --- | --- | --- |
|  | Type | Concentration (g/L) | Type | Concentration (g/L) | Reaction temperature (° C.) | Additive agent | pH (#1) | pH (#2) | Viscosity (mPa·s) | Reaction time (hr) | | |
| Example 75 | AgNO₃ | 26 | MN | 50 | 60 | NH₃ *d | 11 | 8 | 1 | 1 | 15.0 | 8 |
| Example 76 | AgNO₃ | 26 | Et | 5 | 30 | NH₃ *d | 11 | 8 | 1 | 3 | 20.0 | 35 |
| Example 77 | AgNO₃ | 26 | Ma | 13 | 25 | NH₃ *d | 11 | 8 | 1 | 1.5 | 95.0 | 28 |
| Comparative Example 12 | AgNO₃ | 26 | Ma | 13 | 80 | NH₃ *d | 11 | 8 | 1 | 1.5 | 330.0 | 85 |
| Example 78 | AgNO₃ | 26 | GT | 30 | 60 | NH₃ *d | 11 | 8 | 1 | 3 | 88.0 | 38 |
| Comparative Example 13 | AgNO₃ | 26 | GT | 30 | 110 | NH₃ *d | 11 | 8 | 1 | 3 | 290.0 | 260 |

Type of metal compound
AgNO₃: Silver nitrate
Type of reducing agent
MN: Mannose
Et: Ethanol
Ma: Malic acid
GT: Glutathione
Type of additive agent
NH₃: Aqueous ammonia
*d: Polyvinyl pyrrolidone (K30 grade: WAKO PURE CHEMICAL IND., LTD.)
pH
1: pH of the silver nitrate ammonia solution
2: pH of the entire reaction system mPa·s at this reaction temperature, and the pH was 8. After treating the resulting colloidal silver solution in the same manner as in Example 67, the particle-size distribution was measured. As a result, a broad peak was recognized centering at a point of 600 nm.

Comparative Example 16

A colloidal silver solution was produced as in Example 67 except that riboflavin was used instead of fructose, that the reaction temperature was 80° C., and that the reaction time was 2 hrs. The riboflavin concentration in the reaction system was 38 g/L. The exchange-current density of the reaction system was 135.0 µA/cm$^2$. The viscosity of the reaction system was 1 mPa·s at this reaction temperature, and the pH was 8. After treating the resulting colloidal silver solution in the same manner as in Example 67, the particle-size distribution was measured. As a result, a broad peak was recognized centering at a point of 88 nm.

Comparative Example 17

A colloidal silver solution was produced as in Example 67 except that titanium trichloride was used instead of fructose and that the reaction temperature was 5° C. The titanium trichloride concentration in the reaction system was 16 g/L. The exchange-current density of the reaction system was 2500.0 µA/cm$^2$. The viscosity of the reaction system was 1 mPa·s at this reaction temperature, and the pH was 8. After treating the resulting colloidal silver solution in the same manner as in Example 67, the particle-size distribution was measured. As a result, a broad peak was recognized centering at a point of 1200 nm.

The results are shown in Table 13. The symbols used in the Table are as follows:

With the results shown in the Table, it was found that when the reducing activity of the reducing agent is too high, the exchange-current density of the oxidation-reduction reaction cannot be controlled to 100 µA/cm2 or less even if the other conditions are regulated and that consequently the particle size of metal powder cannot be decreased.

<Production of Gold Powder>

Example 79

Tetrachloroaurate (III) tetrahydrate was dissolved in deionized water, and then polyvinyl pyrrolidone (K25 grade: WAKO PURE CHEMICAL IND., LTD.) used as a macromolecular dispersing agent was completely dissolved in the solution. Then, a solution which was prepared by dissolving fructose as a reducing agent in deionized water was added to the gold chloride solution. Thus, a liquid-phase reaction-system was prepared. The gold concentration in the reaction system was 41 g/L, the fructose concentration was 50 g/L, and polyvinyl pyrrolidone concentration was 16 g/L.

Then, the reaction system was subjected to reaction by being put under conditions of a reaction temperature of 10° C. for 2 hrs while it was stirred at 1000 rpm with a magnetic stirrer, and thereby a red-purple colloidal gold solution showing plasmon absorption was produced. The exchange-current density of the reaction system measured by the above-mentioned method was 1.0 µA/cm$^2$. The viscosity of the reaction system was 1 mPa·s at this reaction temperature, and the pH was 2.

The resulting colloidal gold solution was repeatedly centrifuged at 20000 G for 20 minutes to remove impurities that were lighter than the gold powder. Then, the gold powder was washed with deionized water. A particle-size distribution was measured with a particle-size distribution analyzer (Product No. UPA150EX of Microtrac: NIKKISO CO., LTD.) utiliz-

TABLE 13

| | Metal Compound | | Reducing agent | | Reaction system | | | | | | Exchange- current density (µA/cm$^2$) | Particle size of silver powder (nm) |
|---|---|---|---|---|---|---|---|---|---|---|---|---|
| | Type | Concentration (g/L) | Type | Concentration (g/L) | Reaction temperature (° C.) | Additive agent | pH (#1) | pH (#2) | Viscosity (mPa · s) | Reaction time (hr) | | |
| Comparative Example 14 | AgNO$_3$ | 26 | FA | 5 | 60 | NH$_3$ *d | 11 | 8 | 1 | 3 | 580.0 | 125 |
| Comparative Example 15 | AgNO$_3$ | 26 | NB | 4 | 60 | NH$_3$ *d | 11 | 8 | 1 | 3 | 1800.0 | 600 |
| Comparative Example 16 | AgNO$_3$ | 26 | RF | 38 | 80 | NH$_3$ *d | 11 | 8 | 1 | 2 | 135.0 | 88 |
| Comparative Example 17 | AgNO$_3$ | 26 | TC | 16 | 5 | NH$_3$ *d | 11 | 8 | 1 | 3 | 2500.0 | 1200 |

Type of metal compound
AgNO$_3$: Silver nitrate
Type of reducing agent
FA: Formalin
NB: Sodium borohydride
RF: Riboflavin
TC: Titanium trichloride
Type of additive agent
NH$_3$: Aqueous ammonia
*d: Polyvinyl pyrrolidone (L30 grade: WAKO PRE CHEMICAL IND., LTD.)
pH
1: pH of the silver nitrate ammonia solution
2: pH pf the entire reaction system ing a laser Doppler method, and as a result of the measurement, a sharp peak was recognized at a point of 1.5 nm.

Example 80

A colloidal gold solution was produced as in Example 79 except that the reaction temperature was 30° C. The exchange-current density of the reaction system was 2.0 μA/cm². The viscosity of the reaction system was 1 mPa·s at this reaction temperature, and the pH was 2. After treating the resulting colloidal silver solution in the same manner as in Example 79, the particle-size distribution was measured. As a result, a sharp peak was recognized at a point of 2 nm.

Example 81

A colloidal gold solution was produced as in Example 79 except that the reaction temperature was 60° C. The exchange-current density of the reaction system was 15.0 μA/cm². The viscosity of the reaction system was 1 mPa·s at this reaction temperature, and the pH was 2. After treating the resulting colloidal silver solution in the same manner as in Example 79, the particle-size distribution was measured. As a result, a sharp peak was recognized at a point of 60 nm.

Example 82

A colloidal gold solution was produced as in Example 79 except that ascorbic acid was used instead of fructose and that the reaction temperature was 5° C. The ascorbic acid concentration in the reaction system was 26 g/L. The exchange-current density of the reaction system was 70.0 μA/cm². The viscosity of the reaction system was 1 mPa·s at this reaction temperature, and the pH was 2. After treating the resulting colloidal silver solution in the same manner as in Example 79, the particle-size distribution was measured. As a result, a sharp peak was recognized at a point of 25 nm.

Example 83

A colloidal gold solution was produced as in Example 82 except that the reaction temperature was 30° C. The exchange-current density of the reaction system was 80.0 μA/cm². The viscosity of the reaction system was 1 mPa·s at this reaction temperature, and the pH was 2. After treating the resulting colloidal silver solution in the same manner as in Example 79, the particle-size distribution was measured. As a result, a sharp peak was recognized at a point of 55 nm.

Comparative Example 18

A colloidal gold solution was produced as in Example 82 except that the reaction temperature was 60° C. The exchange-current density of the reaction system was 300.0 μA/cm². The viscosity of the reaction system was 1 mPa·s at this reaction temperature, and the pH was 2. After treating the resulting colloidal silver solution in the same manner as in Example 79, the particle-size distribution was measured. As a result, a broad peak was recognized centering at a point of 400 nm.

The results are shown in Table 14. The symbols used in the Table are as follows:

TABLE 14

| | Metal Compound | | Reducing agent | | Reaction system | | | | Reaction time (hr) | Exchange-current density (μA/cm²) | Particle size of gold powder (nm) |
|---|---|---|---|---|---|---|---|---|---|---|---|
| | Type | Concentration (g/L) | Type | Concentration (g/L) | Reaction temperature (° C.) | pH | Viscosity (mPa·s) | Additive agent | | | |
| Example 79 | TCAu | 41 | FL | 50 | 10 | 2 | 1 | *e | 2 | 1.0 | 1.5 |
| Example 80 | TCAu | 41 | FL | 50 | 30 | 2 | 1 | *e | 2 | 2.0 | 2 |
| Example 81 | TCAu | 41 | FL | 50 | 60 | 2 | 1 | *e | 2 | 15.0 | 60 |
| Example 82 | TCAu | 41 | As | 26 | 5 | 2 | 1 | *e | 2 | 70.0 | 25 |
| Example 83 | TCAu | 41 | As | 26 | 30 | 2 | 1 | *e | 2 | 80.0 | 55 |
| Comparative Example 18 | TCAu | 41 | As | 26 | 60 | 2 | 1 | *e | 2 | 300.0 | 400 |

Type of metal compound
TCAu: Hydrogen tetrachloroaurate (III) tetrahydrate
Type of reducing agent
FL: Fructose
As: Ascorbic acid
Type of additive agent
*e: Polyvinyl pyrrolidone (K25 grade: WAKO PURE CHEMICAL IND., LTD.)

With the results of Examples shown in the Table, it was found that the exchange-current density of the oxidation-reduction reaction can be decreased by decreasing reaction temperature and that thereby the particle size of gold powder can be decreased.

INDUSTRIAL APPLICABILITY

Using the method of producing metal powder according to the present invention, catalysts having a structure in which the powder of a noble-metal such as platinum is deposited on surfaces of carrier particles can be produced. The resulting catalysts, after treatment such as filtration, washing, drying, and activation, can be applied to fuel cells and off-gas cleanup.

Furthermore, using the method of producing metal powder according to the present invention, the powder can be provided, in a state of colloid prepared by dispersing the powder in a dispersion medium such as water or an organic solvent, or in a state of powder prepared by subjecting the powder to filtration, washing, drying, and so on, for use as pigment applied to, for example, the production of ink-jet ink or conductive paste. For example, electric wiring on a print circuit board can be formed with an ink-jet printer by utilizing ink-jet ink using such gold or silver powder as conductive pigment, or metallic printing can be performed with an ink-jet printer by utilizing ink-jet ink using the gold or silver powder as metallic pigment. Furthermore, electric wiring on a print circuit board can be formed by screen printing using conductive paste utilizing the gold or silver powder as conductive pigment.

The invention claimed is:

1. A method of producing a metal powder, comprising:
a step of reducing ions of a metal by precipitation with a reducing agent in a liquid-phase reaction system so that the metal is precipitated as metal powder particles,
wherein the metal ions are reduced under conditions in which the exchange-current density of an oxidation-reduction reaction between the metal ions and the reducing agent is less than 100 $\mu A/cm^2$, the exchange-current density being determined by the mixed potential theory, and
a particle size of the metal powder particles is 60 nm or less.

2. The method of producing metal powder according to claim 1, wherein the reducing agent is a reducing saccharide or a glycitol.

3. The method of producing metal powder according to claim 1, wherein the metal powder particles are precipitated on the surfaces of carrier particles by reducing the metal ions under conditions in which the carrier particles are dispersed in the liquid-phase reaction systems.

4. The method of producing metal powder according to claim 3, wherein the carrier particles are carbon or inorganic compound particles.

5. The method of producing metal powder according to claim 1, wherein the metal ions are reduced in the liquid-phase reaction system such that the metal powder particles are individually independently precipitated.

* * * * *